(12) United States Patent
Lin et al.

(10) Patent No.: US 8,415,211 B2
(45) Date of Patent: Apr. 9, 2013

(54) SEMICONDUCTOR DEVICE, METHOD OF FABRICATING THE SAME, AND PATTERNING MASK UTILIZIED BY THE METHOD

(75) Inventors: Yi-Chun Lin, Hsinchu (TW);
Kuo-Ming Wu, Hsinchu (TW);
Ruey-Hsin Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/301,657

(22) Filed: Nov. 21, 2011

(65) Prior Publication Data
US 2012/0061737 A1    Mar. 15, 2012

Related U.S. Application Data

(62) Division of application No. 11/430,243, filed on May 9, 2006, now Pat. No. 8,093,663.

(51) Int. Cl.
*H01L 21/8234* (2006.01)

(52) U.S. Cl. ............................. 438/197; 257/E21.625

(58) Field of Classification Search ........................ None
See application file for complete search history.

(56) References Cited

U.S. PATENT DOCUMENTS

| 4,968,639 | A | 11/1990 | Bergonzoni |
| 5,990,504 | A | 11/1999 | Morifuji |
| 6,121,666 | A | 9/2000 | Burr |
| 6,468,870 | B1 | 10/2002 | Kao et al. |
| 6,740,944 | B1 | 5/2004 | McElheny et al. |
| 6,753,574 | B2 | 6/2004 | Yamaguchi et al. |
| 6,888,205 | B2 | 5/2005 | Moscatelli et al. |
| 7,262,447 | B2 | 8/2007 | Negoro et al. |
| 2002/0145166 | A1 | 10/2002 | Kachelmeier |
| 2003/0207521 | A1 * | 11/2003 | Tanaka et al. ................. 438/200 |
| 2004/0171202 | A1 | 9/2004 | Kim |
| 2005/0029582 | A1 | 2/2005 | Mallikarjunaswamy |
| 2007/0155079 | A1 | 7/2007 | Kim |

FOREIGN PATENT DOCUMENTS

TW    452889    9/2001

* cited by examiner

*Primary Examiner* — Benjamin Sandvik
(74) *Attorney, Agent, or Firm* — Birch, Stewart, Kolasch & Birch, LLP

(57) ABSTRACT

A semiconductor device. The device comprises an active region isolated by an isolation structure on a substrate. The device further comprises a gate electrode extending across the active area and overlying the substrate, a pair of source region and drain region, disposed on either side of the gate electrode on the substrate in the active area, and a gate dielectric layer disposed between the substrate and the gate electrode. The gate dielectric layer comprises a relatively-thicker high voltage (HV) dielectric portion and a relatively-thinner low voltage (LV) dielectric portion, wherein the HV dielectric portion occupies a first intersection among the drain region, the isolation structure, and the gate electrode, and a second intersection among the source region, the isolation structure, and the gate electrode.

7 Claims, 20 Drawing Sheets

SEMICONDUCTOR DEVICE, METHOD OF FABRICATING THE SAME, AND PATTERNING MASK UTILIZIED BY THE METHOD

This application is a Divisional of application Ser. No. 11/430,243 filed on May 9, 2006 now U.S. Pat. No. 8,093,663. The entire contents of all of the above applications are hereby incorporated by reference.

BACKGROUND OF THE INVENTION

1. Field of the Invention

The invention relates to semiconductor technology and in particular to devices for low gate voltage and higher drain breakdown performance.

2. Description of the Related Art

In many applications it is desirable to have a variety of logic devices, memory devices and device capable of withstanding large transients (hereon referred to as power devices) all on a single substrate. One type of power device is a diffused metal-oxide-semiconductor transistor (DMOS).

Heretofore most lateral diffused metal oxide semiconductor, (LDMOS) structures built on a substrate with one or more other device structures have been formed by first forming a high voltage tank. The devices are isolated by field oxide (FOX) processes or shallow trench isolation (STI) regions. However, in a critical understanding, the inventors have found that the isolation (e.g., FOX) regions under the gate electrode have problems that lower the breakdown voltage.

A semiconductor device is disclosed to improve the breakdown voltages. The device comprises an additional dielectric block covering the FOX region thereof to improve the breakdown voltages. This structure effectively works but potentially increases the processing steps and cost thereof due to formation of the dielectric block. Thus, more cost-effective structures and processes are needed.

BRIEF SUMMARY OF THE INVENTION

The invention provides semiconductor devices, methods of fabricating the same, and patterning mask utilized by the method, providing improvement of breakdown voltages associated with the FOX regions and decreased process cost and steps.

The invention provides a memory device comprising an active region isolated by an isolation structure on a substrate. The device further comprises a gate electrode extending across the active area and overlying the substrate, a pair of source region and drain region, disposed on either side of the gate electrode on the substrate in the active area, and a gate dielectric layer disposed between the substrate and the gate electrode. The gate dielectric layer comprises a relatively-thicker high voltage (HV) dielectric portion and a relatively-thinner low voltage (LV) dielectric portion, wherein the HV dielectric portion occupies a first intersection among the drain region, the isolation structure, and the gate electrode, and a second intersection among the source region, the isolation structure, and the gate electrode.

The invention further provides a method of fabricating a semiconductor device. First, a substrate, comprising an active area isolated by an isolation structure, is provided. The active area comprises predetermined regions for subsequently formed drain and source separated by a predetermined region for a subsequently formed gate. A high voltage (HV) dielectric layer is then formed overlying the substrate. Next, the HV dielectric layer is patterned utilizing a patterning mask, forming an HV dielectric pattern, overlying the predetermined regions for the drain and parts of the predetermined regions for the gate. The HV dielectric pattern occupies a first predetermined intersection among the isolation structure and the predetermined regions for the drain and the gate, and a second predetermined intersection among the isolation structure and the predetermined regions for the source and the gate. The HV dielectric pattern exposes parts of the substrate. Next, a low voltage (LV) dielectric layer, thinner than the HV dielectric layer, is formed overlying the exposed substrate, completing formation of a gate dielectric layer overlying the substrate. The gate dielectric layer comprises the HV dielectric layer acting as an HV dielectric portion and the LV dielectric layer acting as an LV dielectric portion. Next, a gate electrode is formed overlying the gate dielectric layer in the predetermined region therefor, and the isolation structure. The gate dielectric layer is patterned, leaving parts thereof underlying the gate electrode, exposing predetermined regions for subsequently formed drain and source. The remaining HV dielectric portion occupies a first predetermined intersection among the isolation structure, the predetermined region for the drain, and the gate electrode, and a second predetermined intersection among the isolation structure, the predetermined region for the source, and the gate electrode. Finally, the source and the drain are formed respectively in the predetermined regions therefor. The HV dielectric portion occupies a first intersection among the drain region, the isolation structure, and the gate electrode, and a second intersection among the source region, the isolation structure, and the gate electrode.

The invention further provides a patterning mask for patterning a high voltage (HV) dielectric layer overlying an active area. The active area is isolated by an isolation structure of a semiconductor substrate and comprises predetermined regions for a drain and a source separated by a predetermined region for a gate. The patterning mask comprises a transparent substrate and an opaque pattern overlying the transparent substrate. The opaque pattern shelters parts of the HV dielectric layer overlying the predetermined region for the drain and parts of the predetermined region for the gate neighboring the predetermined region for the drain when disposed over the semiconductor substrate during patterning of the HV dielectric layer. The sheltered HV dielectric layer occupies a first predetermined intersection among the isolation structure and the predetermined regions for the drain and the gate, and a second predetermined intersection among the isolation structure and the predetermined regions for the source and the gate.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the subsequent embodiments, the exemplary devices comprise two LDMOS transistors sharing a drain region, N-type acting as a first semiconductor type, and P-type acting as a second semiconductor type. Note that the arrangements and properties shown in the subsequent embodiments are exemplary, and not intended to limit the scope of the invention. Those skilled in the art will recognize the possibility of using various transistor arrangements and types, P-type acts as a first semiconductor type, and N-type acts as a second semiconductor type in the subsequent embodiments.

FIGS. 1A through 1H are top views of a semiconductor device and a fabrication method therefor of a first embodiment of the invention. FIGS. 2A through 2H are cross-sections of FIGS. 1A through 1H along a section line A therein.

Figure 1A:
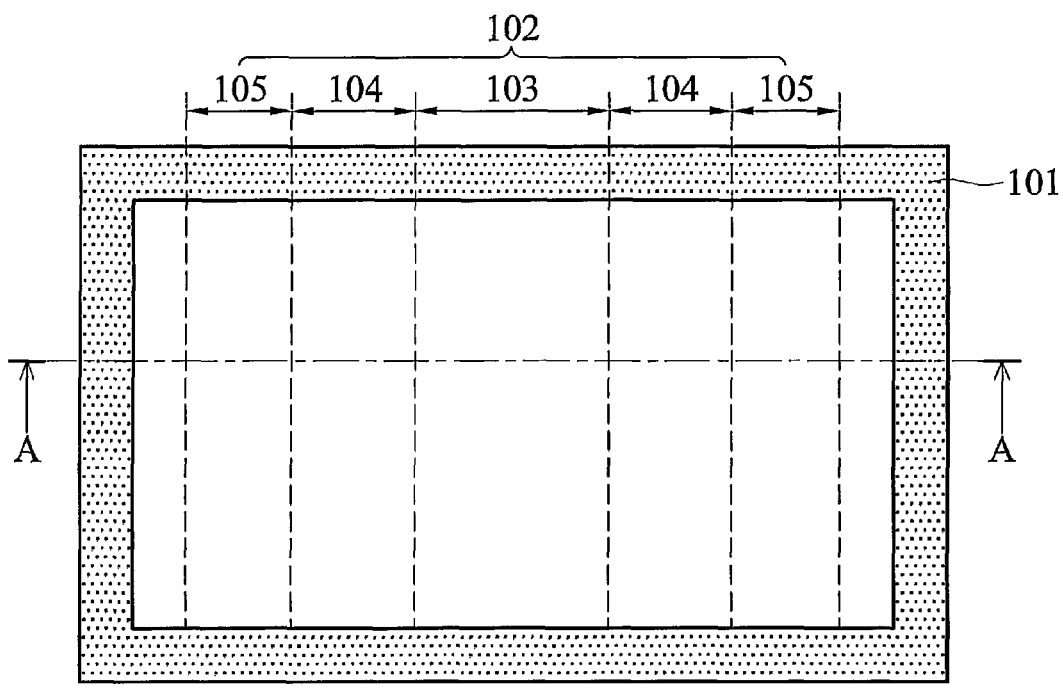
FIGS. 1A through 1H are top views of a semiconductor device and a fabrication method therefor of a first embodiment of the invention.
Figure 2A:
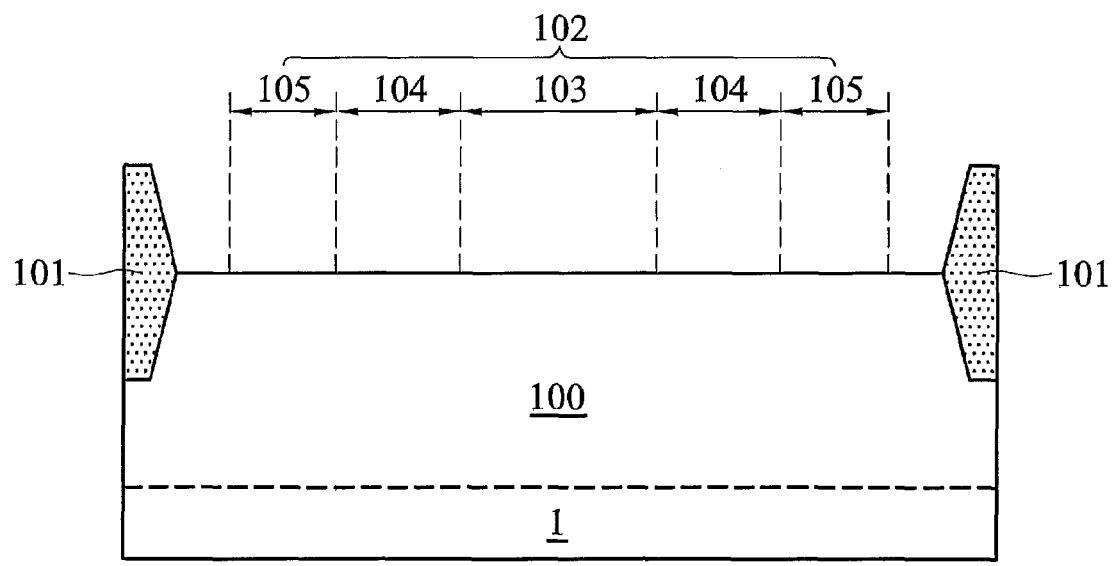
FIGS. 2A through 2H are cross-sections of a semiconductor device and a fabrication method therefor of the first embodiment of the invention.
Figure 2B:
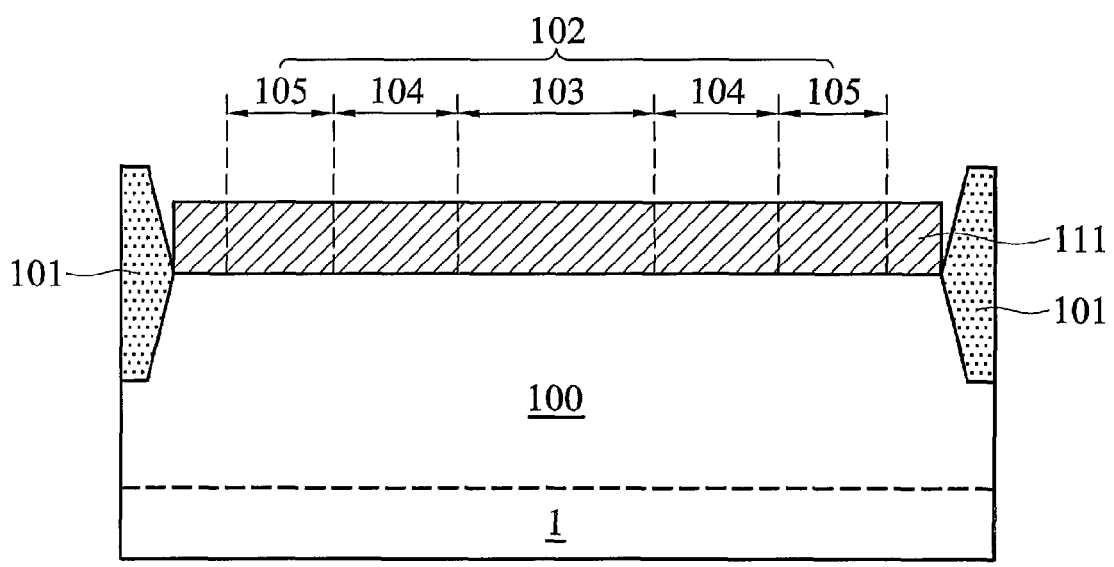

In FIGS. 1A and 2A, a substrate 100 comprising an active area 102 isolated by an isolation structure 101 is provided. The active area 102 comprises predetermined regions 103 and 105 for subsequently formed drain and source separated by a predetermined region 104 for a subsequently formed gate.

The substrate 100 comprises semiconductor materials such as silicon, germanium, silicon germanium, compound semiconductor, or other known semiconductor materials. In some cases, the substrate 100 may be an N-type silicon wafer. In this embodiment, the substrate 100 is an N-type silicon layer or body overlying a P-type silicon wafer 1. The isolation structure 101 may be shallow trench isolation (STI), field oxide (FOX), or other isolation structure, but is FOX in this embodiment.

In FIGS. 1A and 2A, a high voltage (HV) dielectric layer 111 is formed overlying the substrate 100. In some cases, the HV dielectric layer 111 is formed by a known deposition technology and has a predetermined dielectric constant. In this embodiment, the HV dielectric layer 111 is formed by thermal oxidation of the underlying substrate 100, and thus, comprises silicon oxide. The HV dielectric layer 111 is approximately between 200 and 500 Å thick, and those skilled in the art can control the known process parameters to meet a predetermined thickness.

Next, the HV dielectric layer 111 is patterned utilizing the subsequent exemplary photolithographic steps. Note that the steps, tools, and materials shown in FIGS. 1C through 1E and 2C through 2E are exemplary, and not intended to limit the scope of the invention. Those skilled in the art will recognize the possibility of using various steps, tools, and materials to achieve the patterning of the HV dielectric layer 111.

Figure 1B:
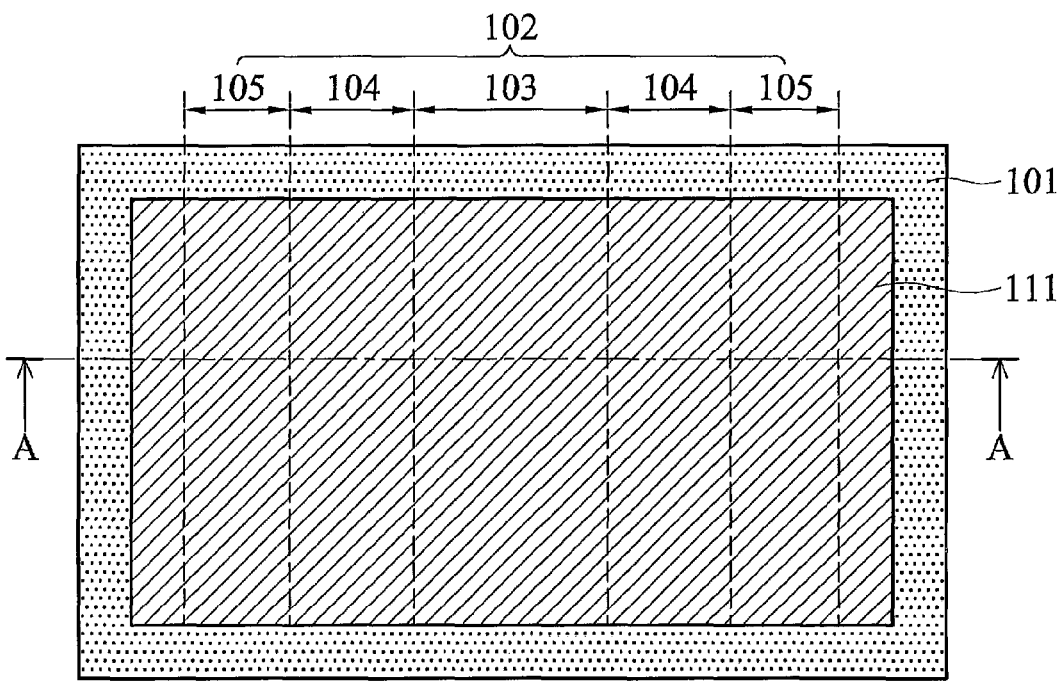
Figure 1C:
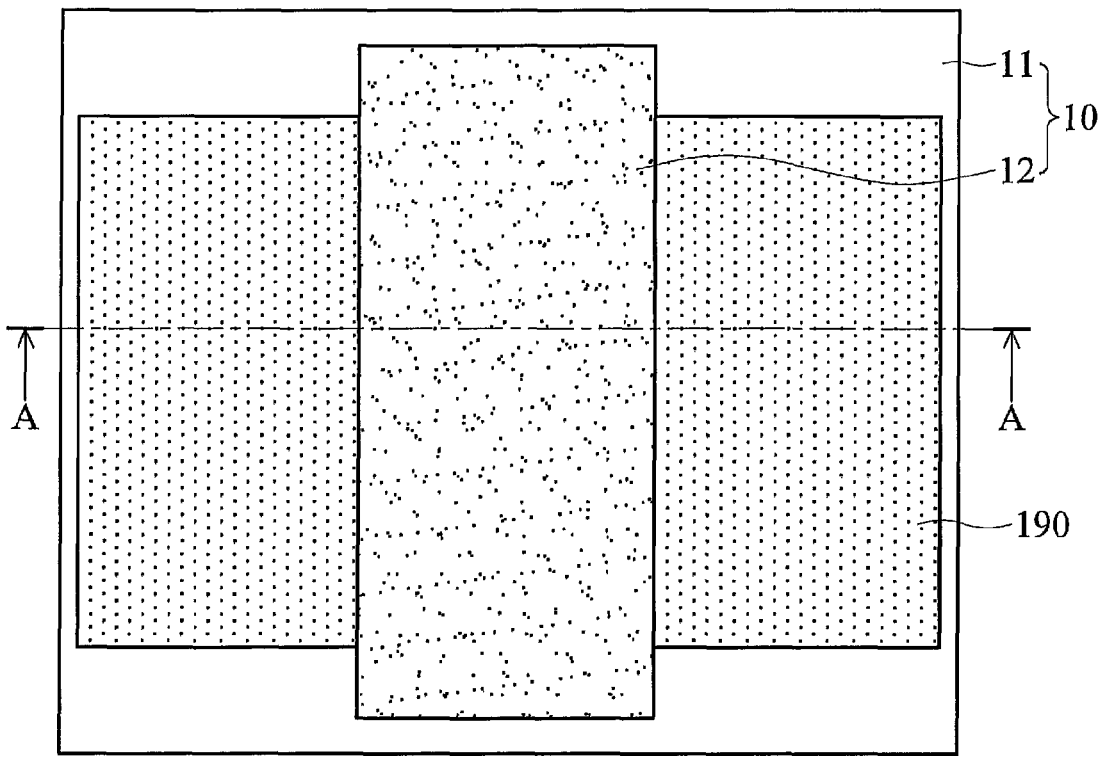
Figure 2C:
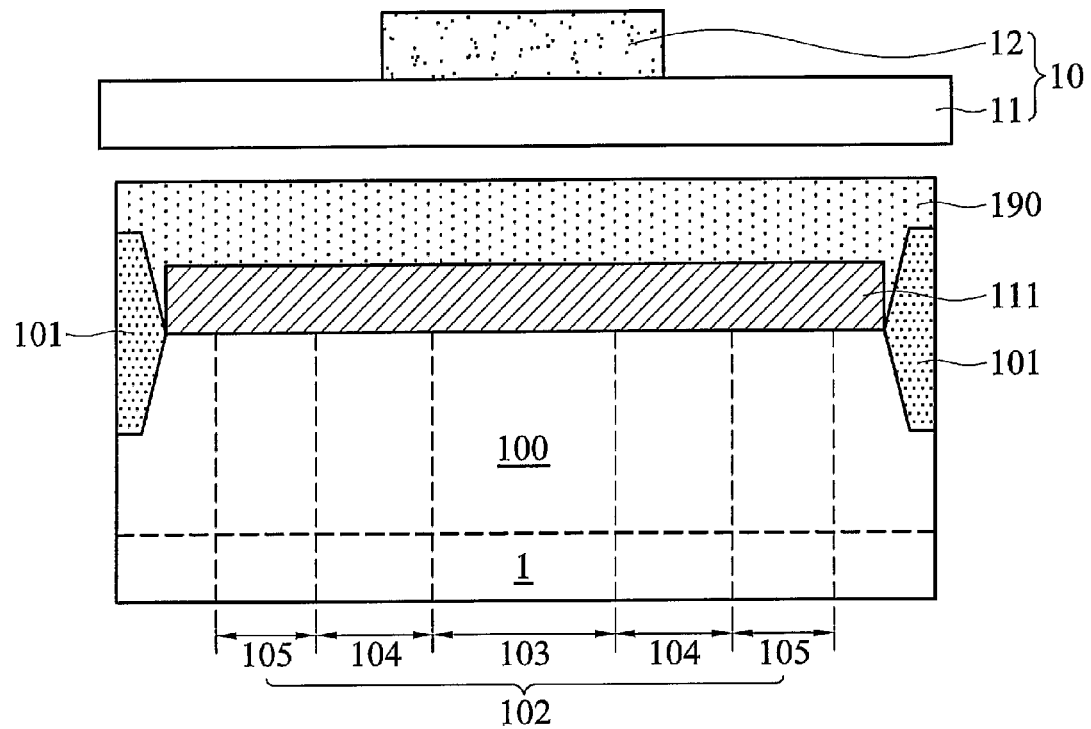

In FIGS. 1C and 2C, a resist layer 190 is formed overlying the HV dielectric layer 111, and then exposed by an energy ray (not shown) through a patterning mask 10. The patterning mask 10 comprises a transparent substrate 11 and an opaque pattern 12 overlying the transparent substrate 11. The opaque pattern 12 is utilized for sheltering parts of the HV dielectric layer 111 overlying the region 103 and parts of the region 104 neighboring to the region 103 when the patterning mask 10 is disposed over the substrate 100 during patterning of the HV dielectric layer 111. Thus, the resist layer 190 overlying the sheltered HV dielectric layer 111 is also sheltered and not exposed to the energy ray.

Figure 1D:
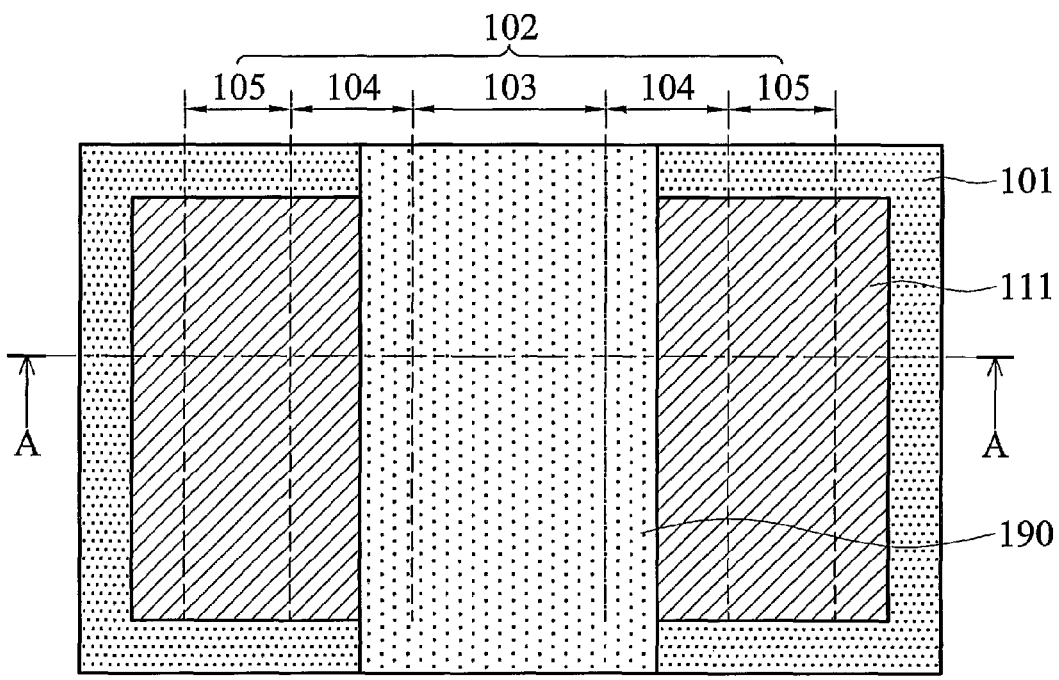
Figure 1E:
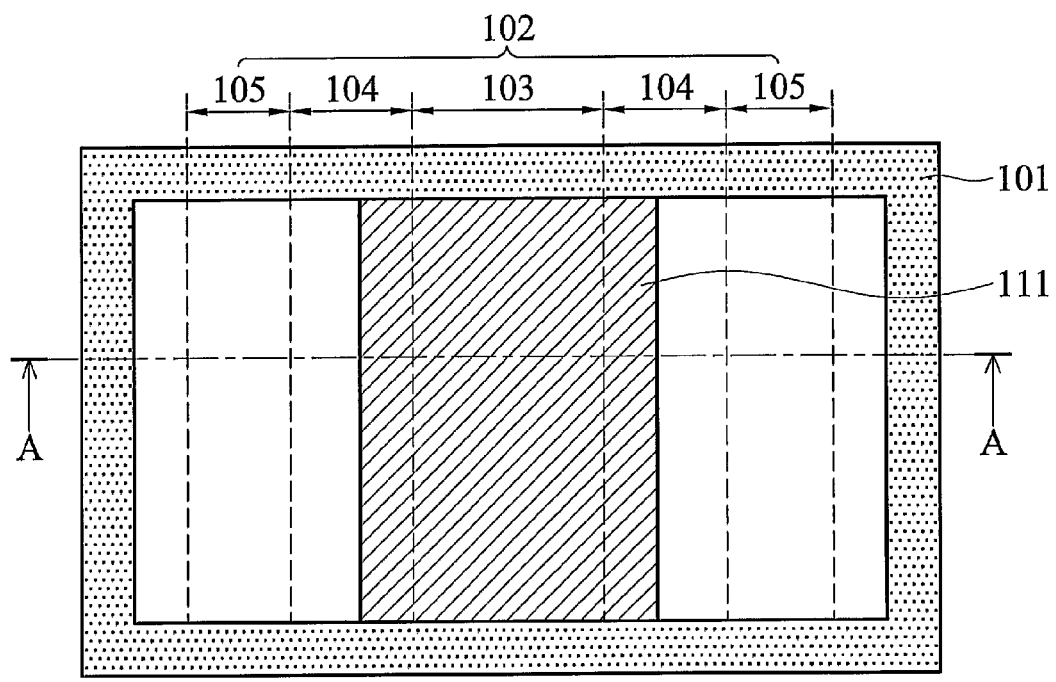
Figure 2D:
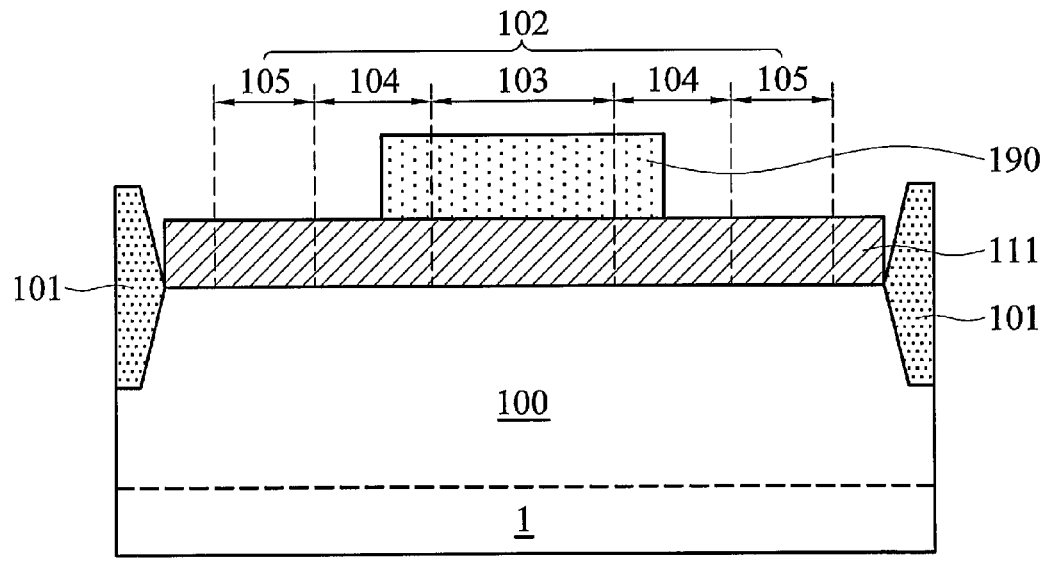
Figure 2E:
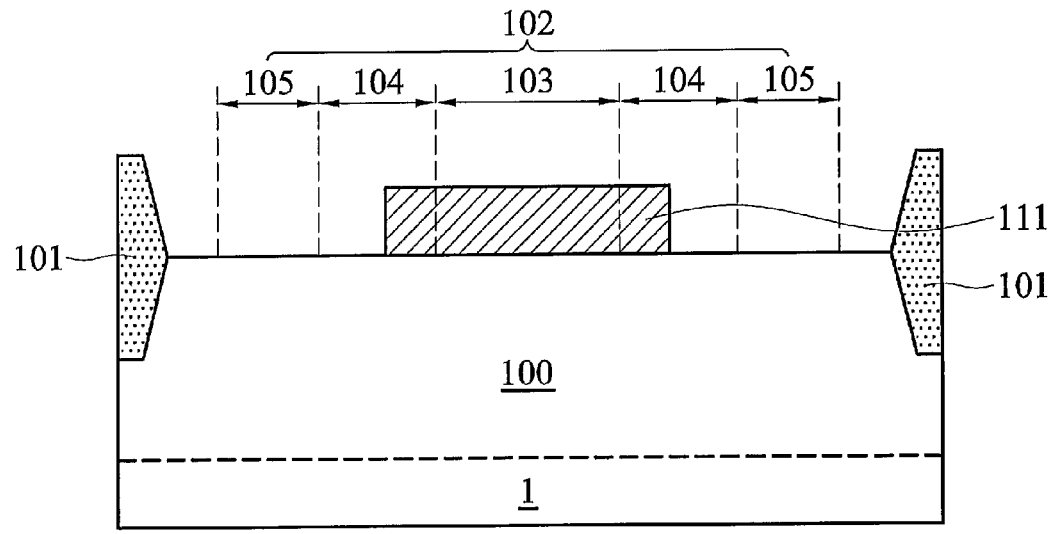

In FIGS. 1D and 2D, the resist layer 190 is developed, removing the exposed parts thereof, exposing parts of the HV dielectric layer 111 in the region 105 and parts of the region 104 neighboring the region 105. The exposed HV dielectric layer 111 is then removed by a method such as etching utilizing the remaining resist layer 190 as an etch mask, leaving the unexposed parts thereof, followed by completely removing the resist layer 190. The result is shown in FIGS. 1E and 2E. The HV dielectric layer 111 overlying the region 103 and parts of the region 104 neighboring the region 103 is left.

The exposed isolation structure 101 may be simultaneously etched during the etch to the HV dielectric layer 111. The isolation structure 101 is typically as thick as thousands of angstroms, and thus, the etched parts thereof are minor relative to its original thickness. The etched parts of the isolation structure 101 are ignored in the subsequent figures.

Figure 1F:
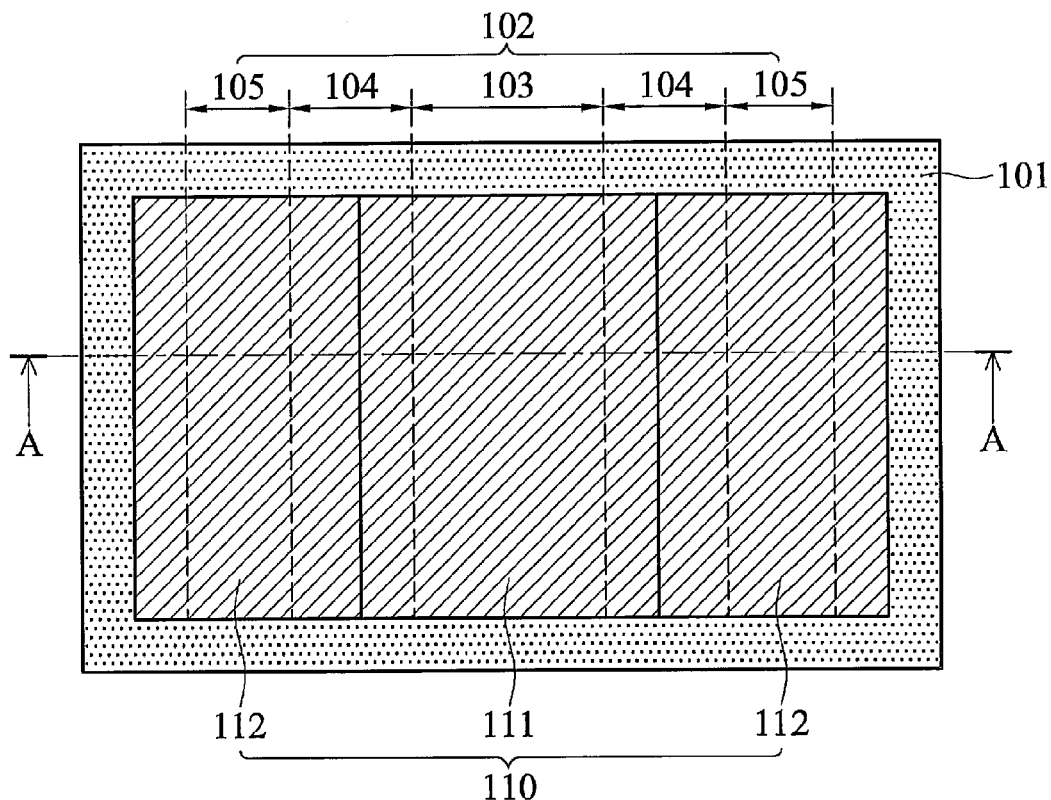
Figure 2F:
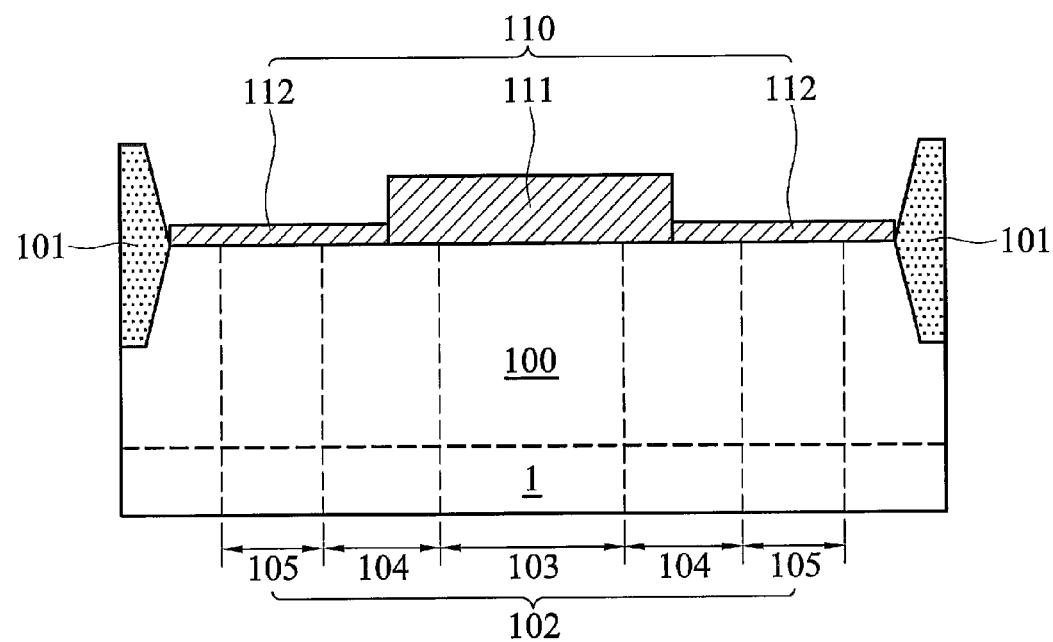

In FIGS. 1F and 2F, a low voltage (LV) dielectric layer 112, thinner than the HV dielectric layer 111, is formed overlying the exposed substrate 100, and thus, formation of a gate dielectric layer 110 overlying the substrate 100 is complete. In some cases, the LV dielectric layer 112 is formed by a known deposition technology and has a predetermined dielectric constant. In this embodiment, the LV dielectric layer 112 is formed by thermal oxidation of the underlying substrate 100, and thus, comprises silicon oxide. The LV dielectric layer 112 is approximately between 40 and 150 Å thick, and those skilled in the art can well control the known process parameters to meet a predetermined thickness. The HV dielectric layer 111 is slightly thickened during formation of the LV dielectric layer 112 to between 210 and 550 Å thick, for example.

Figure 1G:
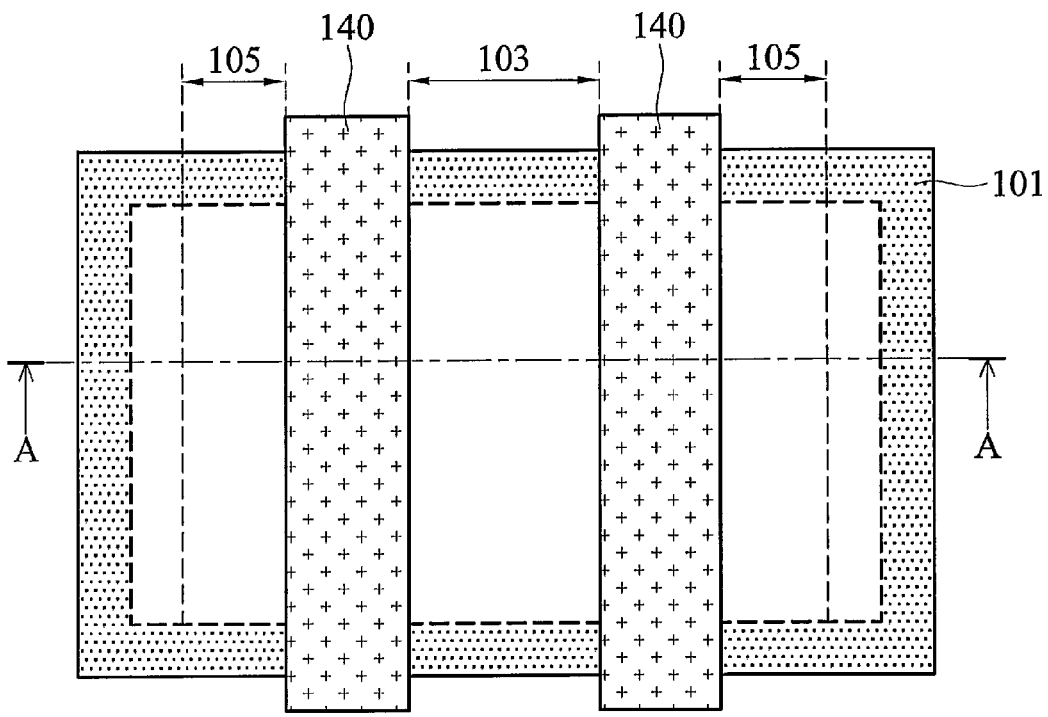
Figure 2G:
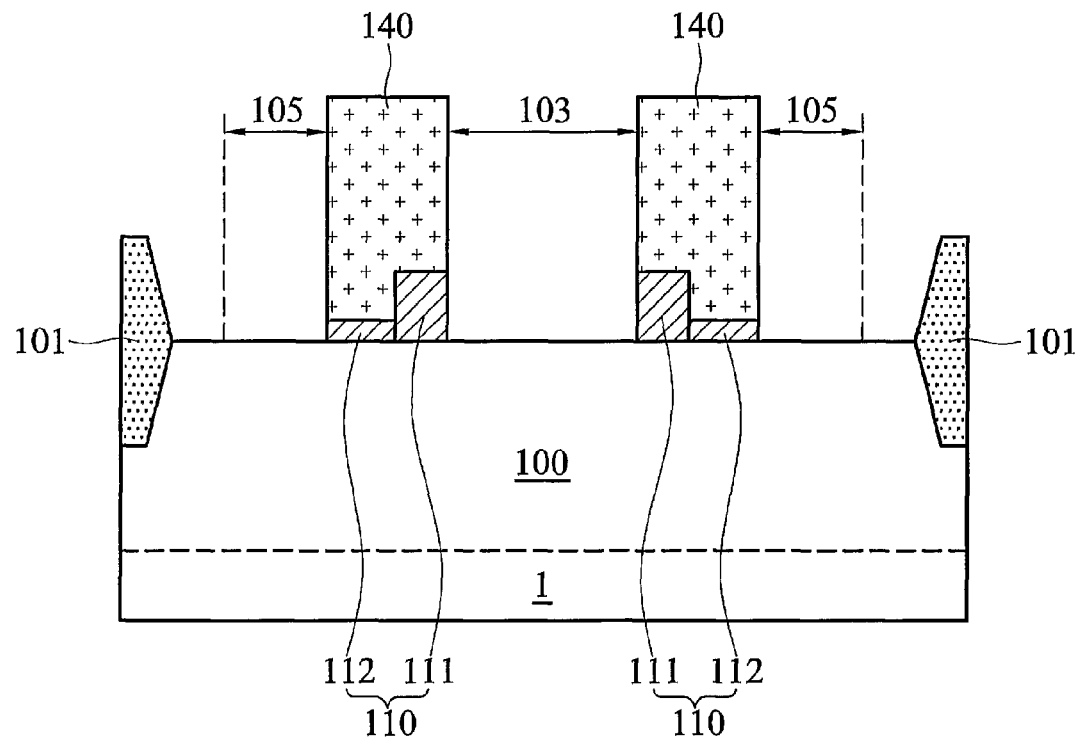

In FIGS. 1G and 2G, a patterned conductive layer is formed overlying the gate dielectric layer 110 in the region 104, and the isolation structure, acting as a gate electrode 140, followed by patterning the gate dielectric layer 110 utilizing the gate electrode 140 as a mask. Only the gate dielectric layer 110 between the substrate 100 and the gate electrode 140 is left.

Figure 1H:
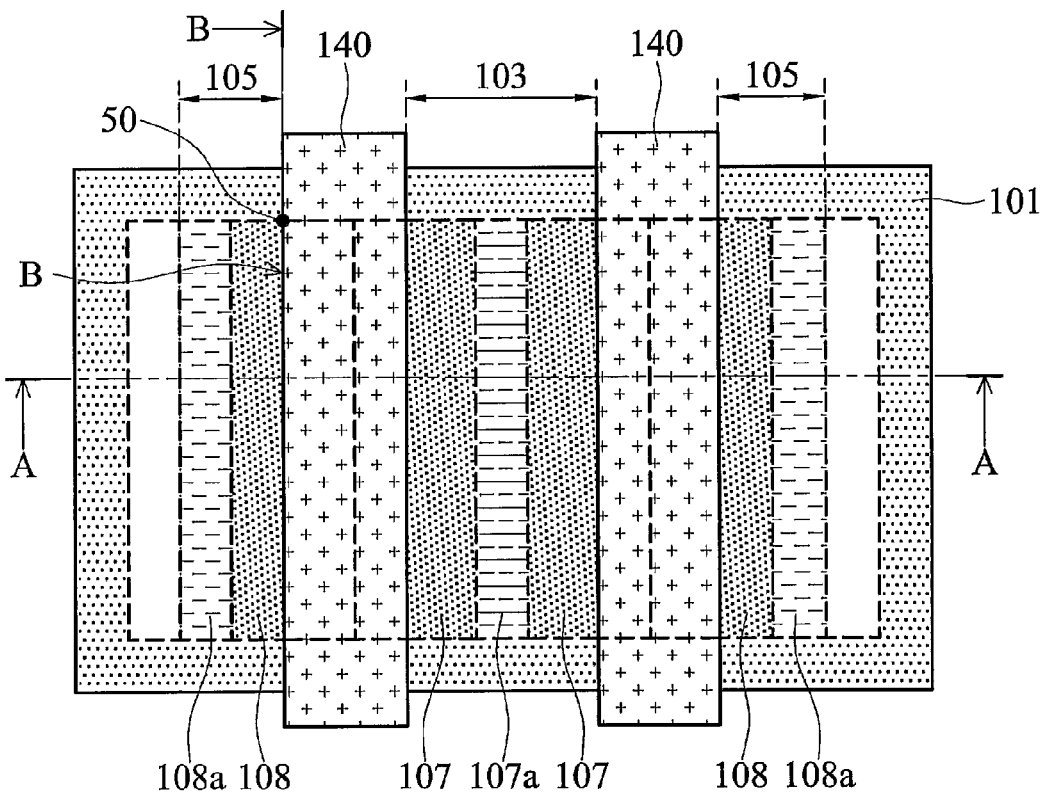
Figure 2H:
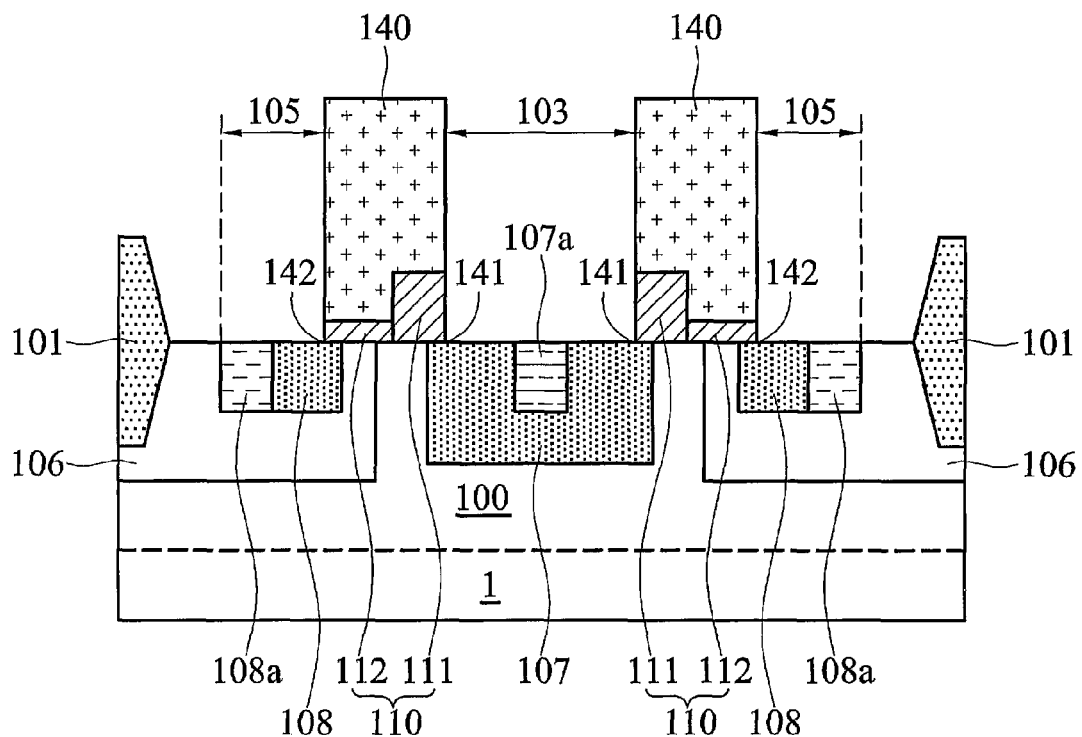

In FIGS. 1H and 2H, a series of ion implanting processes are performed. The following describes an exemplary series of ion implanting processes, and is not intended to limit the scope of the invention. Those skilled in the art will recognize the possibility of using various processes to finish the semiconductor device shown in FIGS. 1H and 2H. First, a patterned mask layer (not shown) is formed overlying the region 103, followed by implantation of the substrate 100 in the region 105 with P-type ions to form a P-type body 106 in the substrate 100. The patterned mask layer is then removed. The P-type body 106 expands beneath the gate electrode 140 to define the channel region of the semiconductor device. Next, N-type ions are implanted in at least parts of the exposed P-type body 106 in the region 105 and the substrate 100 in the region 103, forming a source region 108 and a drain region 107, respectively. In some cases, the drain region 107 may comprise an area 107a with higher dopant concentration than other area thereof. In some cases, one more ion implanting process may be performed to form a P-type area 108a at a side of the source region 108.

The semiconductor device shown in FIGS. 1H and 2H provides the thinner gate dielectric layer 112 at a source side 142 of the gate electrode 140 and the thicker gate dielectric layer 111 at a drain side 141 of the gate electrode 140, providing low gate voltage and higher drain breakdown performance. In FIG. 1H, the distribution of the gate dielectric layer 110 underlying the gate electrode 140 is shown in dashed blocks. Moreover, formation of the thinner gate dielectric layer 112 and the thicker gate dielectric layer 111 can be simultaneously performed with the formation of the gate dielectric layers with different thickness for logic transistors (with thinner gate dielectric layer) and power transistors (with thicker gate dielectric layer). Thus, the inventive device and process do not introduce additional processes, further providing decreased process cost and steps.

Figure 3:
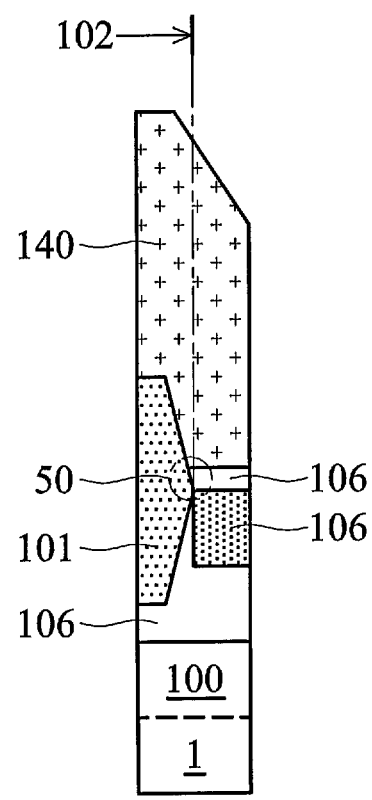
FIG. 3 is another cross-section of a semiconductor device of the first embodiment of the invention.

In FIG. 3, a cross-section of the semiconductor device in FIG. 1H along line B through an intersection 50 among the isolation structure 101, the source region 108, and the gate electrode 140 is shown. The inventors discover the bird's beak of the isolation structure 101 potentially induces lower breakdown voltage in the edge of the active area 102. The subsequent second and third embodiments provide solutions for this issue without adding processing steps or cost.

Figure 4A:
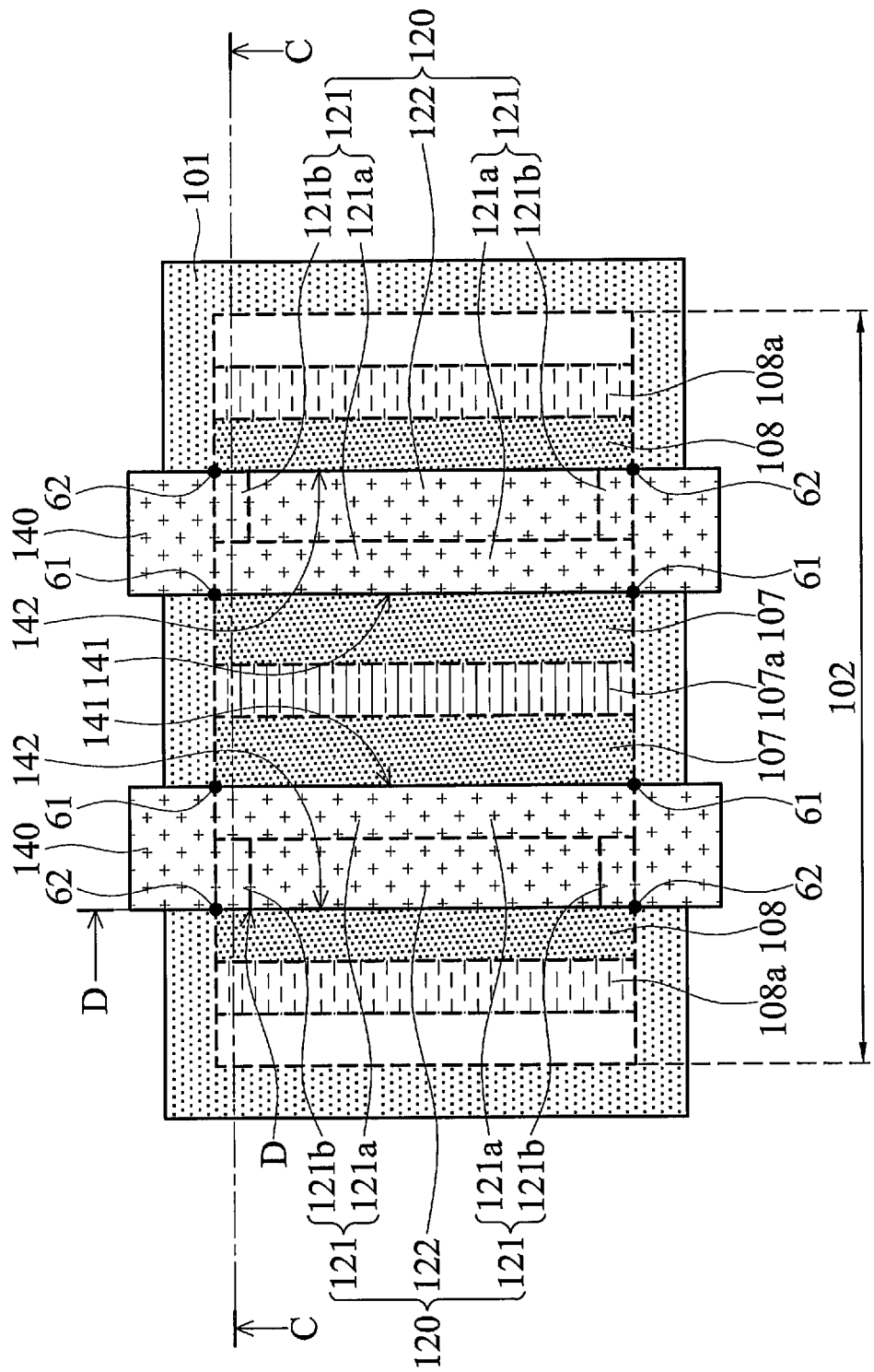
FIGS. 4A through 4C are a top view and cross-sections of a semiconductor device of a second embodiment of the invention.
Figure 4B:
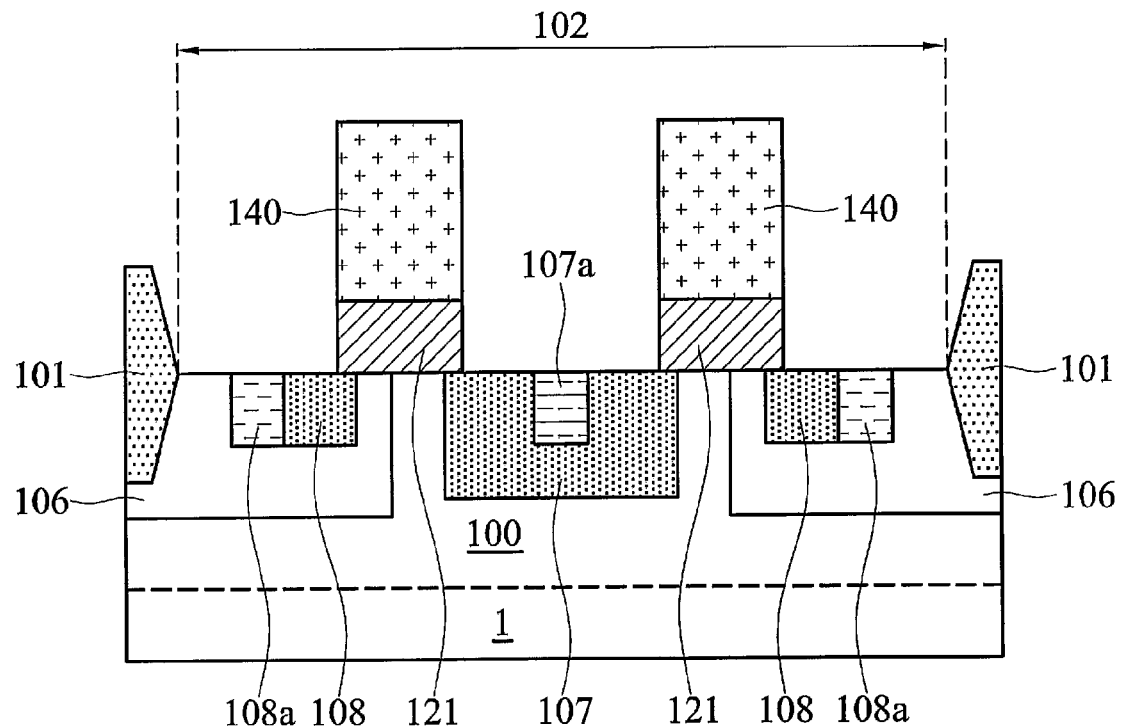

FIG. 4A is a top view of a semiconductor device of a second embodiment of the invention. FIG. 4B is a cross-section of the device along a line C in FIG. 4A, and FIG. 4C is a cross-section of the device along a line D in FIG. 4A.

In FIGS. 4A and 4B, the semiconductor device comprises an active region 102 isolated by an isolation structure 101 on a substrate 100. The semiconductor device further comprises a gate electrode 140, a source region 108, a drain region 107, and a gate dielectric layer 120 in the active region 102. The gate electrode 140 extends across the active area 102 and overlies the substrate 100. The source region 108 and the drain region 107 are formed on the substrate 100 and disposed on either side of the gate electrode 140. Details regarding the substrate 100, the isolation structure 101, the active region 102, the P-type body 106, the drain region 107, the source region 108, the areas 107a and 108a, and the gate electrode 140 are the same as those of the first embodiment, and thus, are omitted herefrom.

In FIGS. 4A and 4B, the gate dielectric layer 120 is disposed between the substrate 100 and the gate electrode 140. In FIG. 4A, the distribution of the gate dielectric layer 120 underlying the gate electrode 140 is shown in dashed blocks. The gate dielectric layer 120 comprises a high voltage (HV) dielectric portion 121 and a thinner low voltage (LV) dielectric portion 122. The HV dielectric portion 121 is preferably between 210 and 550 Å thick. Further, the LV dielectric portion 122 is between 40 and 150 thick. The materials and process for the HV dielectric portion 121 and the LV dielectric portion 122 differ from the thicker gate dielectric layer 111 and the thinner gate dielectric layer 112 described in the first embodiment only in the arrangement thereof. The HV dielectric portion 121 occupies an intersection 61 among the drain region 107, the isolation structure 101, and the gate electrode 104, and an intersection 62 among the source region 108, the isolation structure 101, and the gate electrode 140. Specifically, the gate electrode 140 comprises a drain side 142 neighboring the drain region 107 and a source side 141 neighboring the source region 108. The HV dielectric portion 121 comprises a part 121a, extending along the drain side 142, occupying the intersection 61, and a part 121b occupying the intersection 62. In this embodiment, part 121b of the HV dielectric portion 121 extends from part 121a thereof. Further, a linear dimension L of part 121b of the HV dielectric portion 121, parallel to the extension direction of the gate electrode 140, is preferably compatible as the process window for formation of the HV dielectric portion 121. In this embodiment the linear dimension L is as large as 0.25 µm or greater.

Figure 4C:
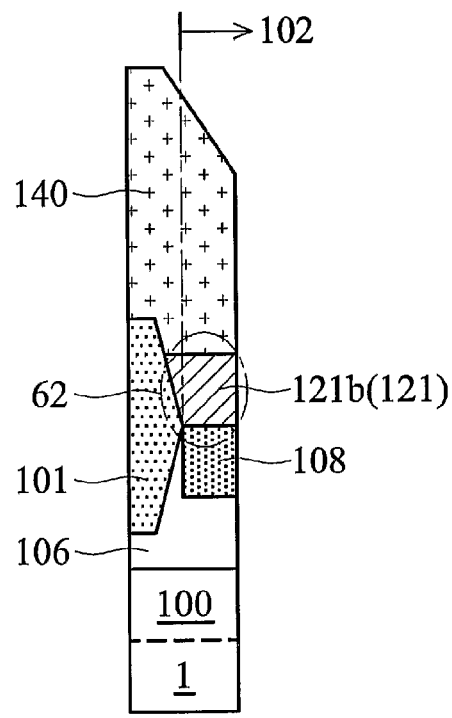

In FIG. 4C, a cross-section of the semiconductor device in FIG. 4A along line D through the intersection 62 is shown. It is appreciated that the inventive device introduces the part 121b of the thicker HV dielectric portion 121 occupying the intersection 62. Similar with the dielectric layer 110 described in the first embodiment, formation of the gate dielectric layer 120 (shown in FIG. 4B) can be simultaneously performed with the formation of the gate dielectric layers with different thickness for logic transistors (with thinner gate dielectric layer) and power transistors (with thicker gate dielectric layer). Thus, the aforementioned lower breakdown voltage due to the bird's beak of the isolation structure 101 can be improved without adding processing steps or cost.

FIGS. 5A through 5E are top views showing preferred steps of a method of fabricating the semiconductor devices of the second embodiment of the invention. FIGS. 6A through 6E are cross-sections of FIGS. 5A through 5E along a section line E therein. The section line E extends through the predetermined regions of the intersections 61 and 62 shown in FIG. 4A.

Details regarding the formation of the HV dielectric layer 121 overlying the substrate 100 are similar to those shown in FIGS. 1A and 1B for the HV dielectric layer 111, and are thus omitted herefrom.

Next, the HV dielectric layer 121 is patterned utilizing subsequent exemplary photolithographic steps. Note that the steps, tools, and materials shown in FIGS. 5A through 5C and 6A through 6C are exemplary, and not intended to limit the scope of the invention. Those skilled in the art will recognize the possibility of using various steps, tools, and materials to achieve the patterning of the HV dielectric layer 121.

Figure 5A:
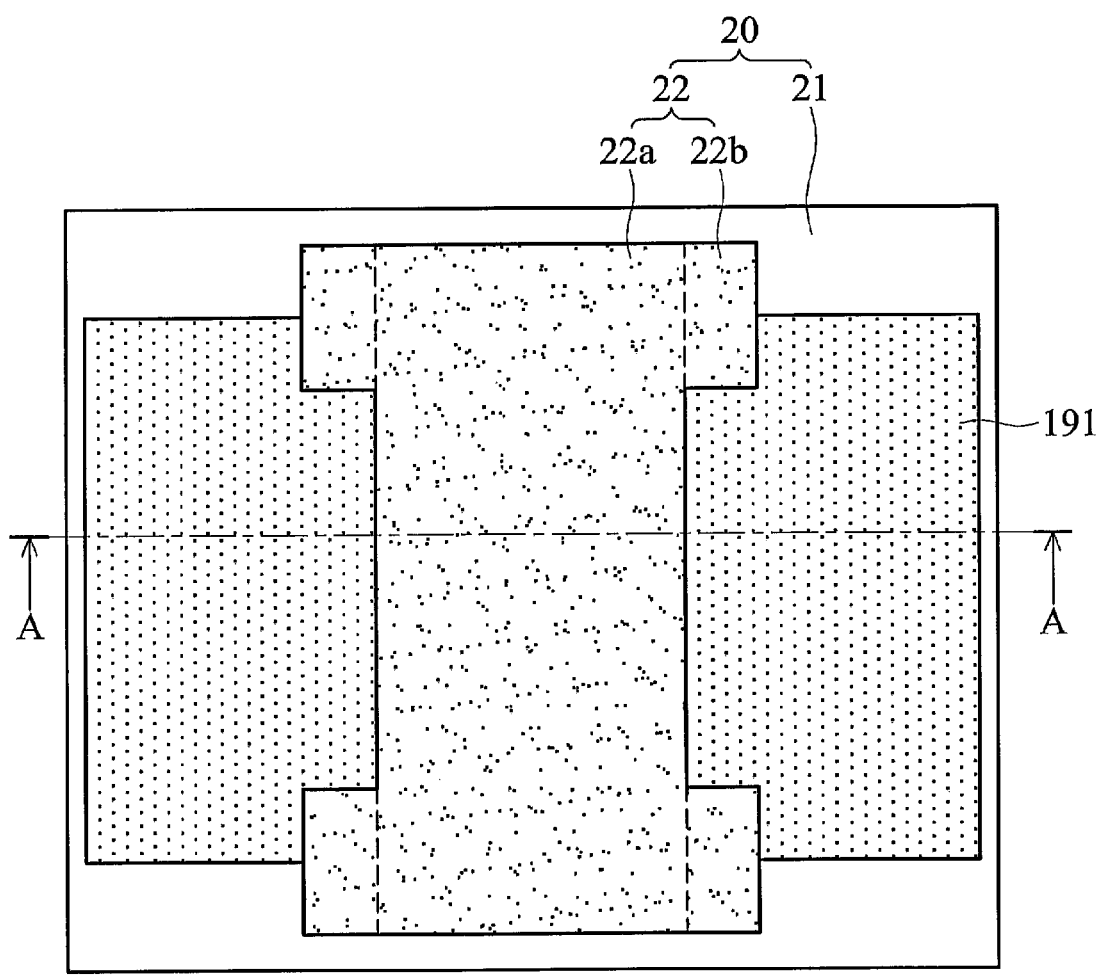
FIGS. 5A through 5E are top views showing preferred steps of a method of fabricating the semiconductor devices of the invention.
Figure 6A:
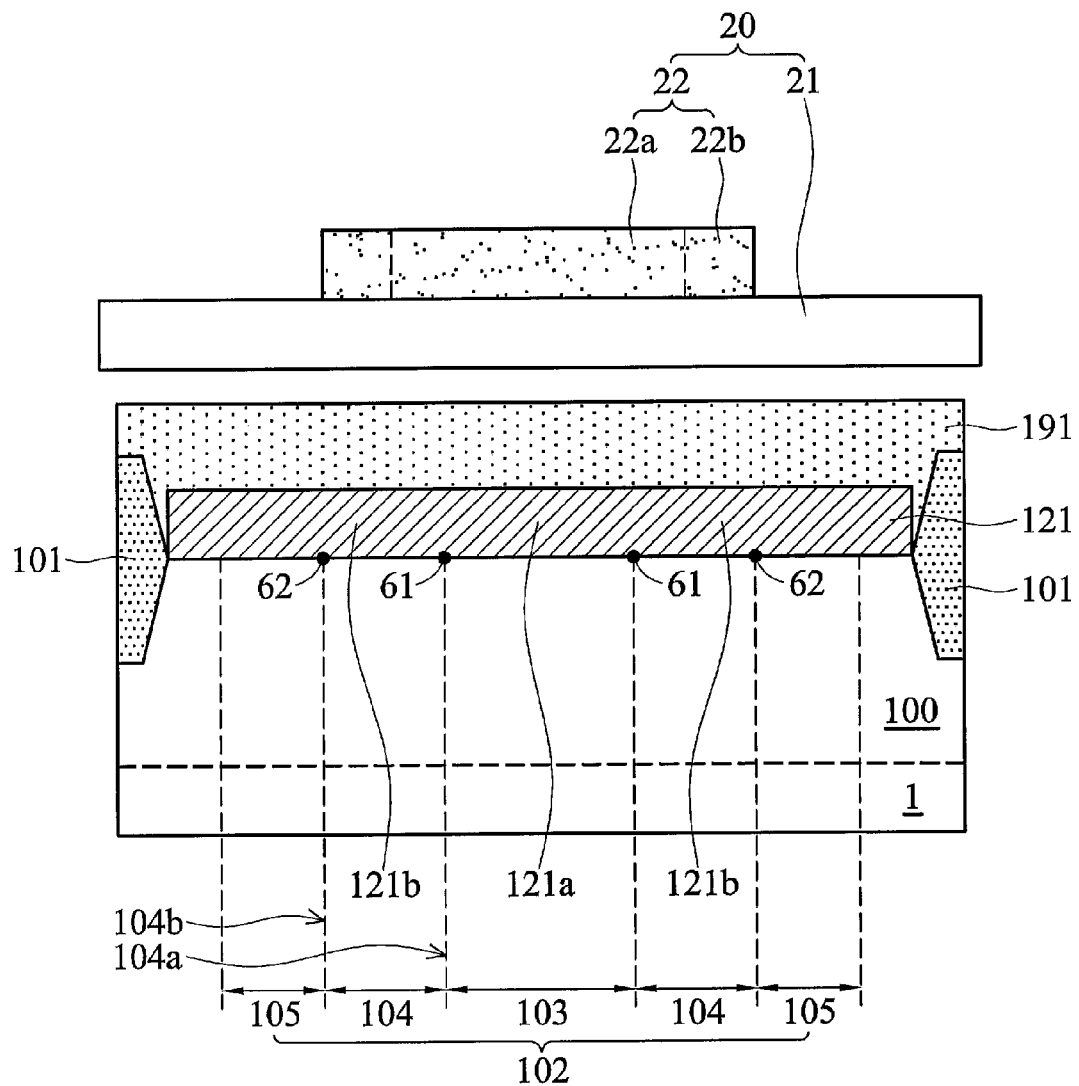
FIGS. 6A through 6E are cross-sections showing preferred steps of a method of fabricating the semiconductor devices of the invention.

In FIGS. 5A and 6A, a resist layer 191 is formed overlying the HV dielectric layer 121, and then exposed to an energy ray (not shown) through a patterning mask 20. The patterning mask 20 comprises a transparent substrate 21 and an opaque pattern 22 overlying the transparent substrate 21. The opaque pattern 22 is utilized for sheltering parts of the HV dielectric layer 121 overlying the region 103 and parts of the region 104 neighboring to the region 103 when the patterning mask 20 is disposed over the substrate 100 during patterning of the HV dielectric layer 120. Thus, the resist layer 191 overlying the sheltered HV dielectric layer 121 is also sheltered and not exposed to the energy ray. As shown in FIG. 6A, the sheltered HV dielectric layer 121 and resist layer 191 by the opaque pattern 22 occupy the predetermined regions for the intersections 61 and 62.

In one embodiment, the region 104 comprises a drain side 104a neighboring the region 103, and a source side 104b neighboring the region 105. The HV dielectric layer 121 sheltered by the opaque pattern 22 of the patterning mask 20 (ignoring the resist layer 191) comprises a first part 121a, overlying the region 103 and the drain side 104a, occupying the predetermined region for the intersection 61, and a second part 121b occupying the predetermined region for the intersection 62. The opaque pattern 22 comprises a first pattern 22a for sheltering the first part 121a of the HV dielectric layer 121, and a second pattern 22b for sheltering the second part 121b of the HV dielectric layer 121 when the patterning mask 20 is disposed over the substrate 100 during patterning of the HV dielectric layer 121. In this embodiment, the second pattern 22b of the opaque pattern 22 extends from the first pattern 22a of the opaque pattern 22 as shown in FIG. 5A. Note that the dashed lines in the opaque pattern 22 shown in FIG. 5A define the first pattern 22a and the second pattern 22b thereof, and do not indicate real "patterns" thereof.

Figure 5B:
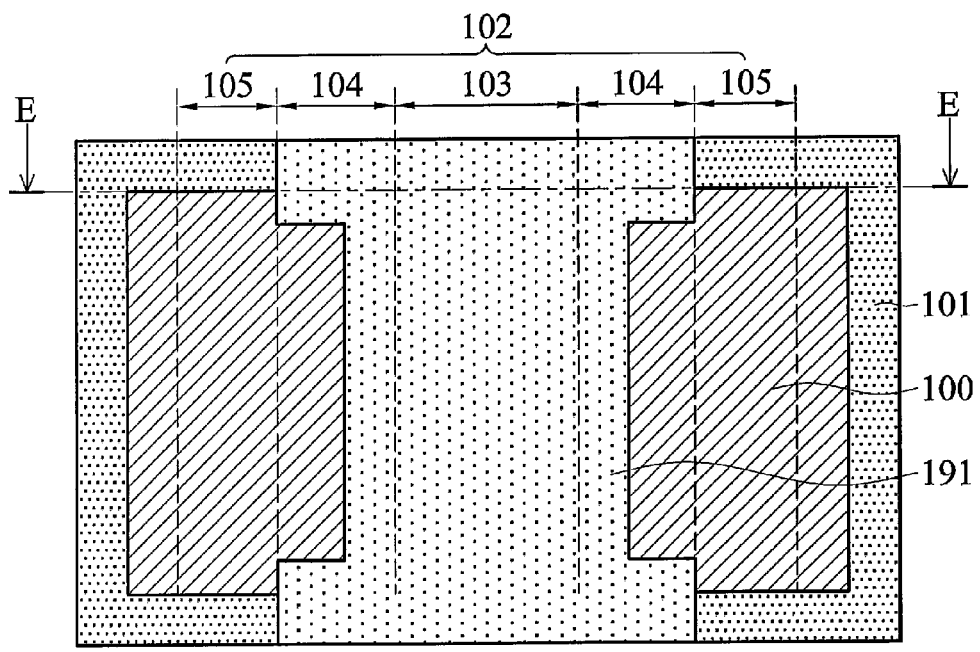
Figure 5C:
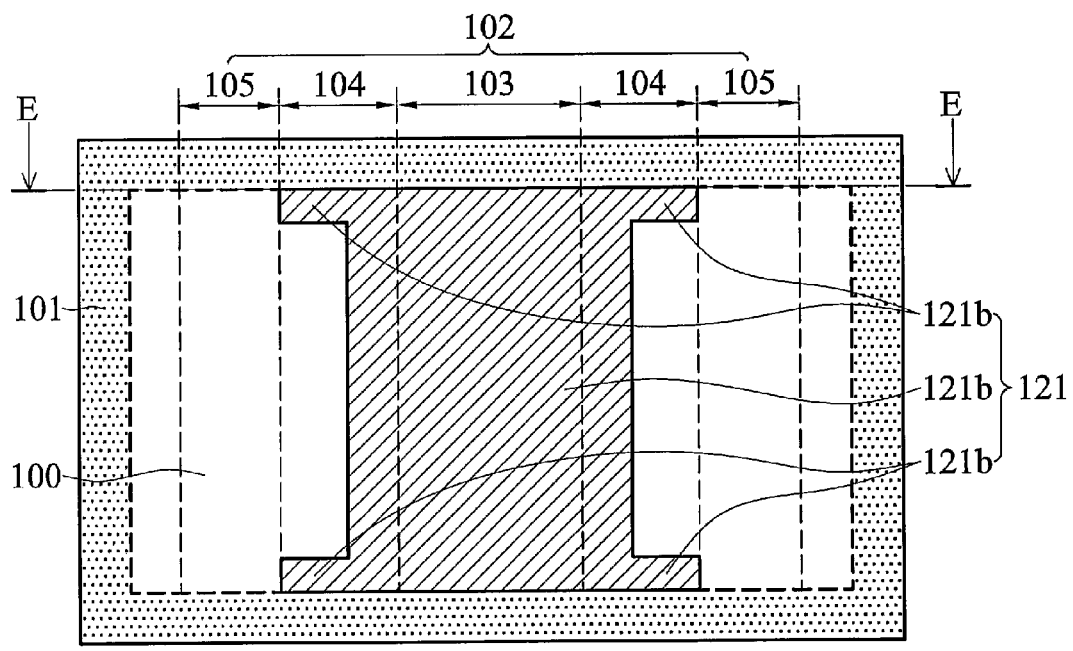
Figure 6B:
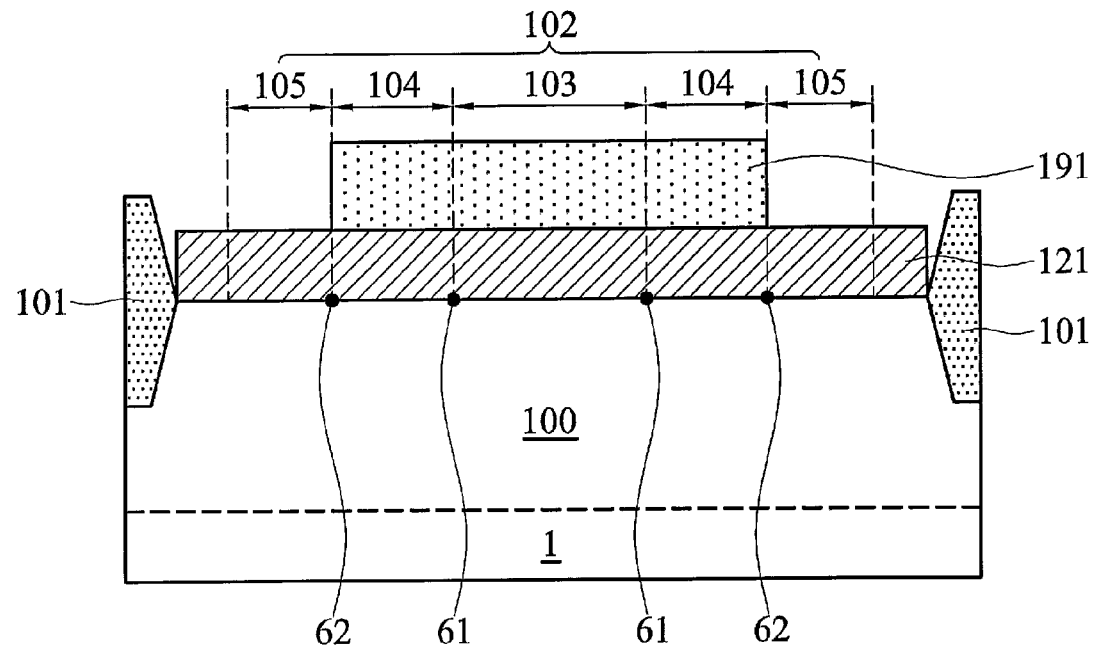

In FIGS. 5B and 6B, the resist layer 191 is developed, removing the exposed parts thereof, exposing parts of the HV dielectric layer 121 sheltered by the opaque pattern 22 of the patterning mask 20 shown in. FIGS. 5A and 6A. The exposed HV dielectric layer 121 is then removed by a method such as etching utilizing the remaining resist layer 191 as an etch mask, leavening the unexposed parts thereof, followed by completely removing the resist layer 191. The result is shown in FIGS. 5C and 6C.

Figure 6C:
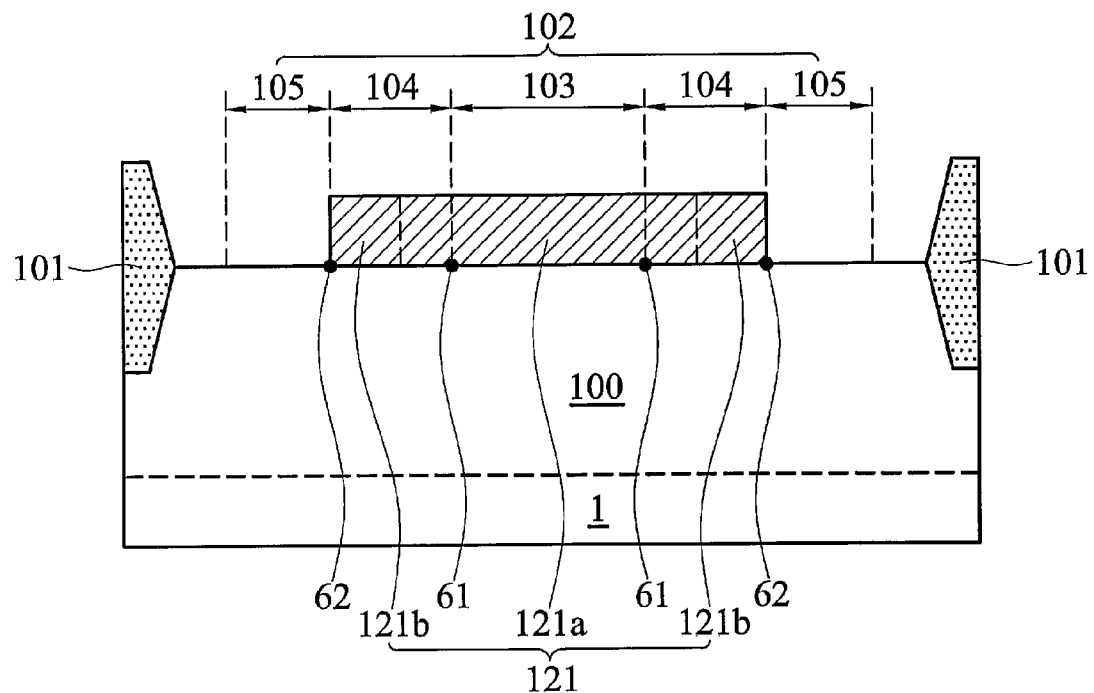

In FIGS. 5C and 6C, the resulting pattern of the HV dielectric layer 121 occupies the predetermined regions for intersections 61 and 62, and exposes parts of the substrate 100. In this embodiment, the first part 121a of the HV dielectric layer 121 occupies the predetermined region for the intersection 61, and the second part 121b of the HV dielectric layer 121 occupies the predetermined region for the intersection 62.

The exposed isolation structure 101 may be simultaneously etched during etching of the HV dielectric layer 121. The isolation structure 101 is typically as thick as thousands of angstroms, and thus, the etched parts thereof are minor relative to its original thickness. The etched parts of the isolation structure 101 are ignored in the subsequent figures.

Figure 5D:
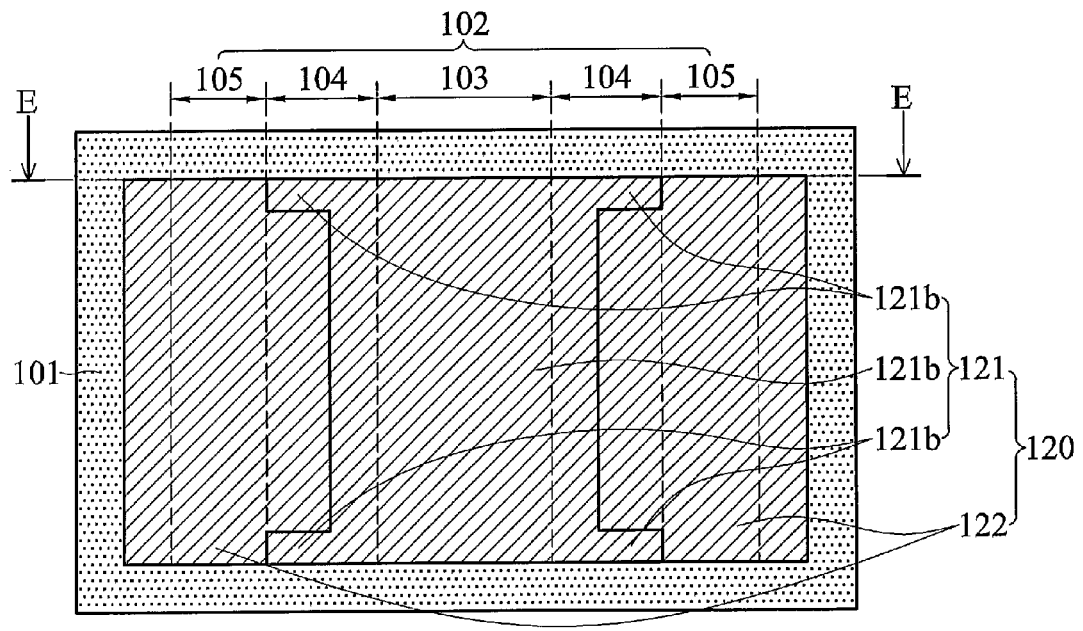
Figure 6D:
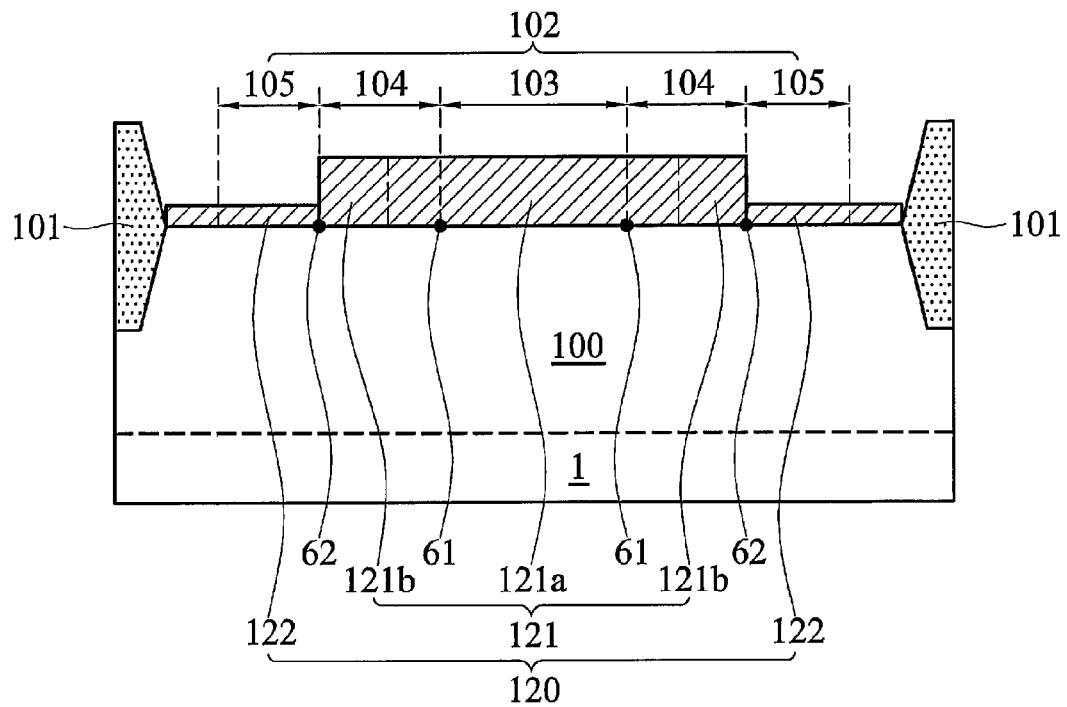

In FIGS. 5D and 6D, a low voltage (LV) dielectric layer 122, thinner than the HV dielectric layer 121, is formed overlying the exposed substrate 100, and thus, formation of the gate dielectric layer 120 overlying the substrate 100 is complete. In some cases, the LV dielectric layer 122 is formed by a known deposition technology and has a predetermined dielectric constant. In this embodiment, the LV dielectric layer 122 is formed by thermal oxidation of the underlying substrate 100, and thus, comprises silicon oxide. The LV dielectric layer 122 is approximately between 40 and 150 Å thick, and those skilled in the art can control the known process parameters to meet a predetermined thickness. The HV dielectric layer 121 is slightly thickened during formation of the LV dielectric layer 122 to between 210 and 550 Å thick, for example. In the resulting gate dielectric layer 120, the HV dielectric layer 121 acts as an HV dielectric portion and the LV dielectric layer 122 acts as an LV dielectric portion.

Figure 5E:
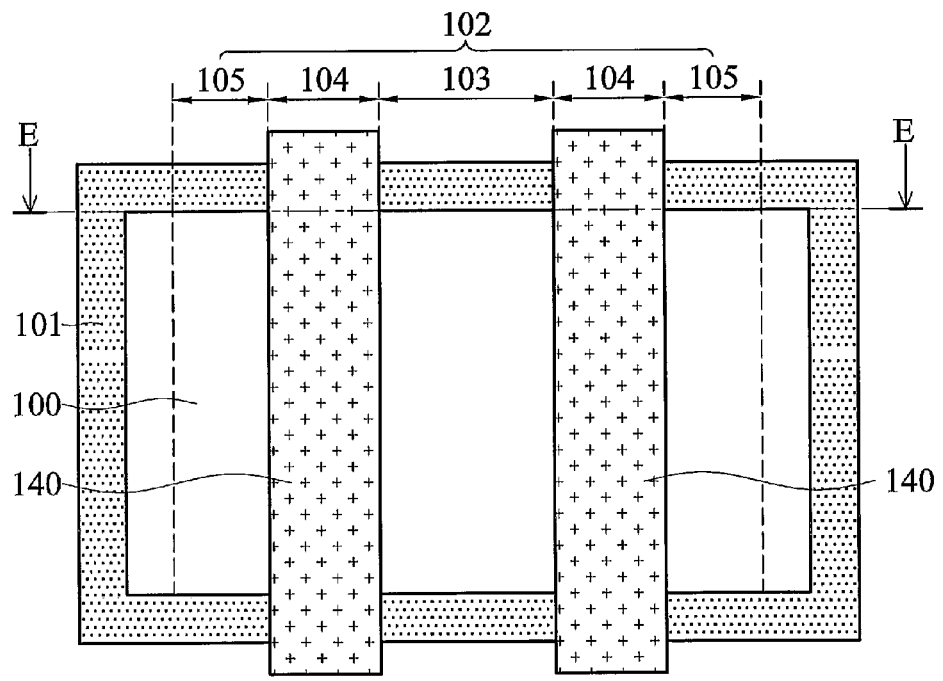
Figure 6E:
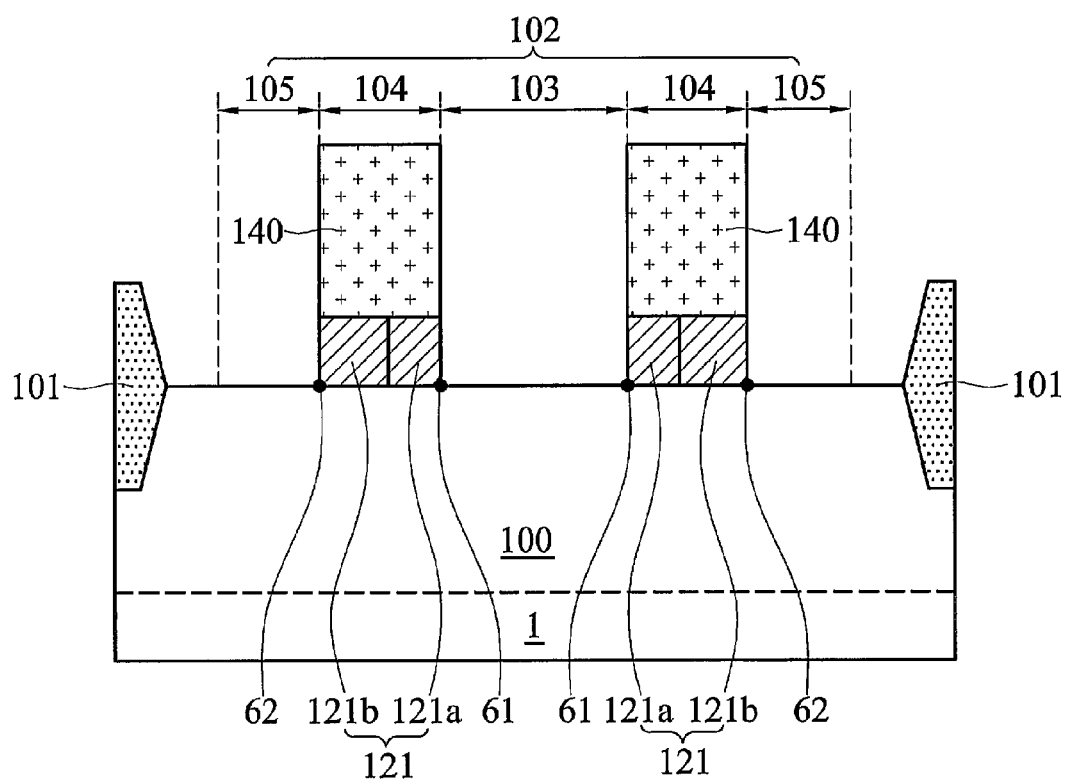

In FIGS. 5E and 6E, a patterned conductive layer is formed overlying the gate dielectric layer 120 in the region 104, and the isolation structure, acting as a gate electrode 140, followed by patterning the gate dielectric layer 120 utilizing the gate electrode 140 as a mask. Only the gate dielectric layer 120 between the substrate 100 and the gate electrode 140 is left, and the regions 103 and 105 of the substrate 100 are exposed. Thus, the remaining HV dielectric portion 121 occupies the predetermined regions for the intersections 61 and 62. In this embodiment, the first part 121a of the HV dielectric portion 121 occupies the predetermined region for the intersection 61, and the second part 121b of the HV dielectric portion 121 occupies the predetermined region for the intersection 62.

Subsequently, a series of ion implanting processes are performed to finish the semiconductor device shown in FIGS. 4A through 4C. For example, the same processes as those described in the first embodiment can be performed, and thus, are omitted herefrom. Thus, the HV dielectric portion 121 occupies the intersections 61 and 62. In this embodiment, the first part 121a of the HV dielectric portion 121 occupies the intersection 61, and the second part 121b of the HV dielectric portion 121 occupies the intersection 62.

Figure 7A:
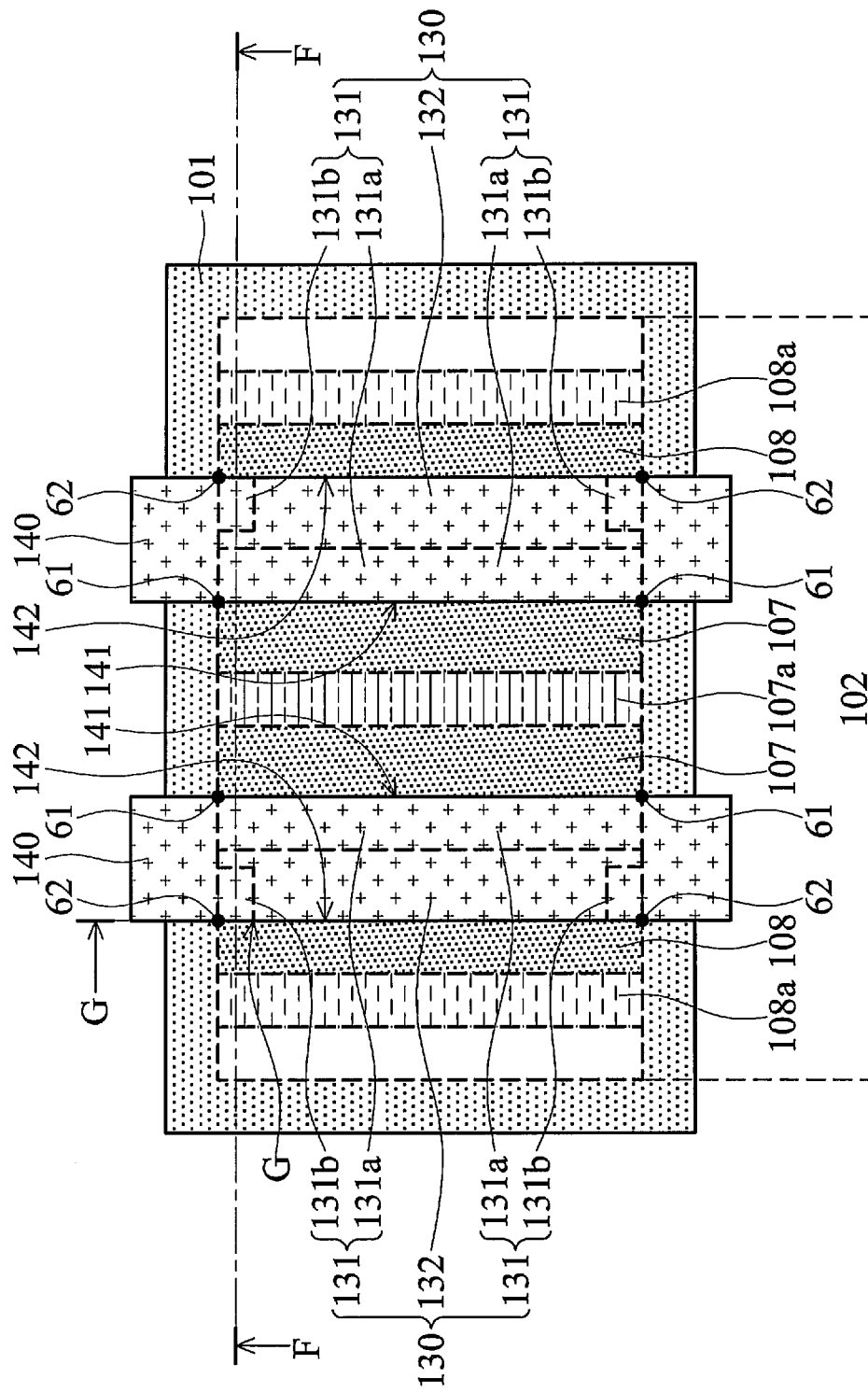
FIGS. 7A and 7B are a top view and a cross-section of a semiconductor device of a third embodiment of the invention.
Figure 7B:
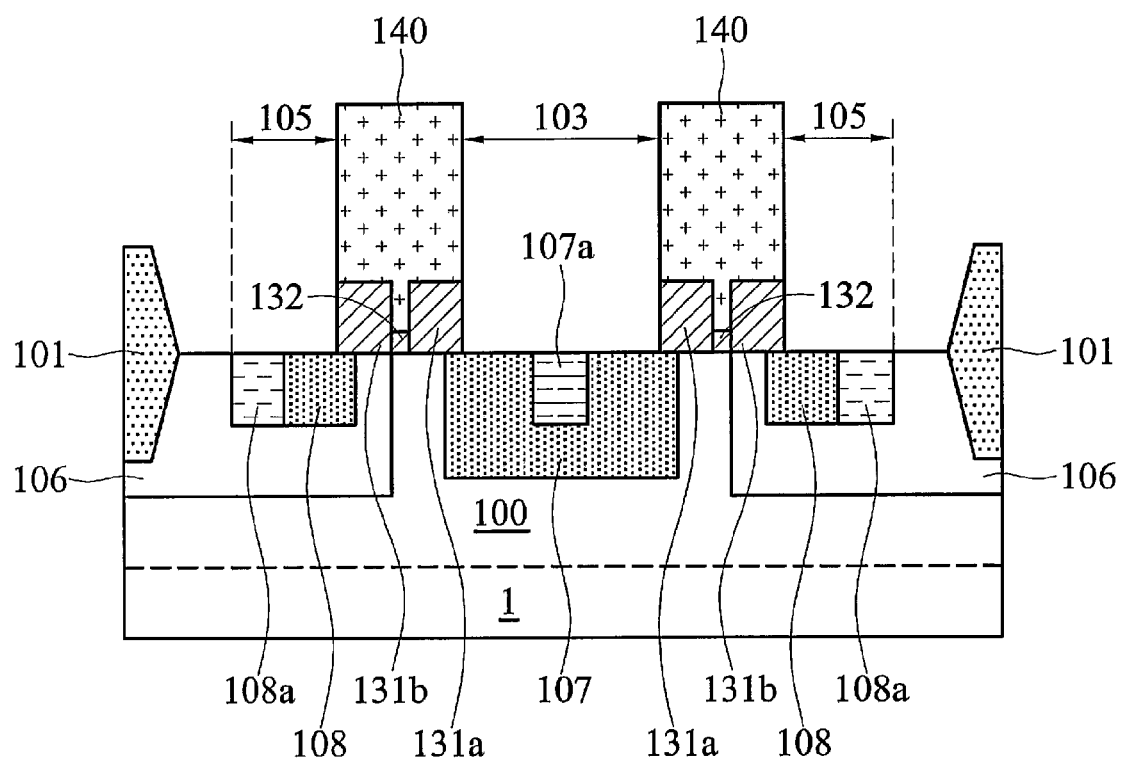

FIG. 7A is a top view of a semiconductor device of a third embodiment of the invention, and FIG. 7B is a cross-section of the device along line F in FIG. 7A.

Compared to that shown in FIGS. 4A and 4B, the gate dielectric layers 120 are replaced by gate dielectric layers 130 as shown in FIGS. 7A and 7B. In FIG. 7A, the distribution of the gate dielectric layer 130 underlying the gate electrode 140 is shown in dashed blocks. Specifically, the gate dielectric layers 120 and 130 are almost equivalent other than the profile thereof. The gate dielectric layer 130 comprises an HV dielectric portion 131 and an LV dielectric portion 132 respectively corresponding to the HV dielectric portion 121 and the LV dielectric portion shown in FIGS. 4A and 4B. The HV dielectric portion 131 comprises parts 131a and 131b respectively corresponding to the parts 121a and 121b shown in FIGS. 4A and 4B. As described, the part 121b extends from the part 121a. In this embodiment, however, the parts 131a and 131b do not directly connect, but indirectly connect via the LV dielectric portion 132. The cross-section of that shown in FIG. 7A along line G through the intersection 62 is the same as that shown in FIG. 4C, and thus, is omitted herefrom. As the device shown in FIGS. 4A and 4B, the semiconductor of this embodiment also provides improved breakdown voltage performance without additional processing steps and cost.

Figure 8:
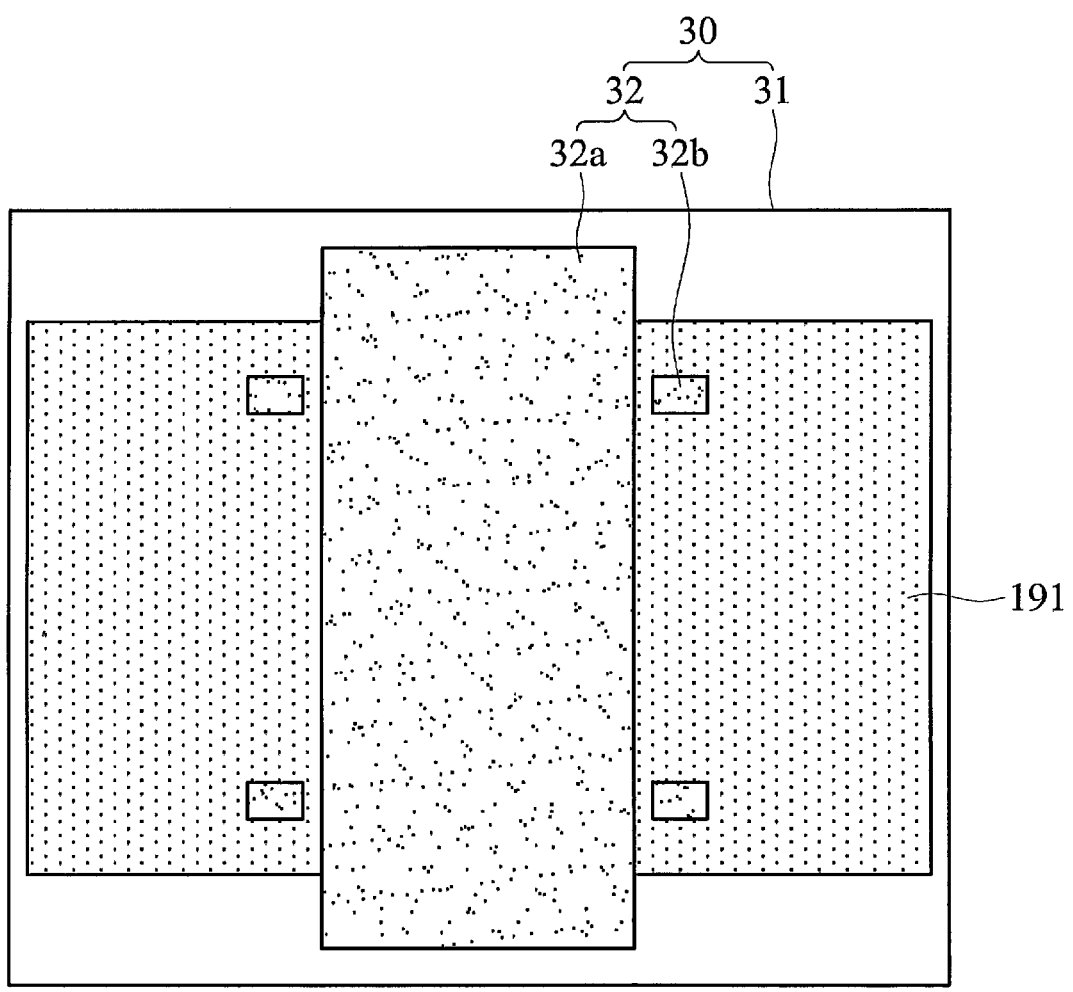
FIG. 8 is a top view of a patterning mask utilized for fabricating the semiconductor devices of the invention.

Referring to FIGS. 5A, 6A and 8, when the patterning mask 20 utilized in the step shown in FIGS. 5A and 6A is replaced by a patterning mask 30 shown in FIG. 8, the resulting device produced by the steps shown in FIGS. 5A through 5E and 6A through 6E is equivalent to that shown in FIGS. 7A and 7B. The patterning mask 30 comprises a transparent substrate 31 and an opaque pattern 32 overlying the transparent substrate 31, respectively corresponding to the transparent substrate 21 and the opaque pattern 22 shown in FIG. 5A. The opaque pattern 32 comprises a first pattern 32a and a second pattern 32b respectively corresponding to the first pattern 22a and the second pattern 22b shown in FIG. 5A. As described, the second pattern 22b extends from the first pattern 22a. In this embodiment, however, the first pattern 32a and the second pattern 32b do not connect.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:

providing a substrate comprising an active area isolated by an isolation structure, the active area comprising predetermined regions for subsequently formed drain and source separated by a predetermined region for a subsequently formed gate;

forming a high voltage (HV) dielectric layer overlying the substrate;

patterning the HV dielectric layer utilizing a patterning mask, forming an HV dielectric pattern, overlying the predetermined regions for the drain and parts of the predetermined regions for the gate, occupying a first predetermined intersection among the isolation structure and the predetermined regions for the drain and the gate, and a second predetermined intersection among the isolation structure and the predetermined regions for the source and the gate, exposing parts of the substrate;

forming a low voltage (LV) dielectric layer, thinner than the HV dielectric layer, overlying the exposed substrate, completing formation of a gate dielectric layer overlying the substrate, wherein the gate dielectric layer comprises the HV dielectric layer acting as an HV dielectric portion and the LV dielectric layer acting as an LV dielectric portion, wherein the HV dielectric portion includes a first part in physical contact with the predetermined drain region but not in contact with the predetermined source region, and a second part in physical contact with the predetermined source region but not in contact with the predetermined drain region, and wherein the first part and the second part are entirely separated by the LV dielectric portion and are not in physical contact with each other;

forming a gate electrode overlying the gate dielectric layer in the region predetermined there, and the isolation structure;

patterning the gate dielectric layer, leaving parts thereof underlying the gate electrode, exposing the predetermined regions for subsequently formed drain and source of the substrate, wherein the remaining HV dielectric portion occupies a first predetermined intersection among the isolation structure, the predetermined region for the drain, and the gate electrode, and a second predetermined intersection among the isolation structure, the predetermined region for the source, and the gate electrode; and forming the source and the drain respectively in the regions predetermined there, wherein the HV dielectric portion occupies a first intersection among the drain region, the isolation structure, and the gate electrode, and a second intersection among the source region, the isolation structure, and the gate electrode.

2. The method as claimed in claim 1, wherein the gate electrode comprises a drain side neighboring the drain region and a source side neighboring the source region, the first part of the HV dielectric portion extends along the drain side and occupies the first intersection, and a second part of the HV dielectric portion occupies the second intersection.

3. The method as claimed in claim 2, wherein the second part comprises a linear dimension, parallel to the extension direction of the gate electrode, as large as 0.25µm or greater.

4. The method as claimed in claim 1, wherein the HV dielectric portion is between 210 and 550 Å thick.

5. The method as claimed in claim 1, wherein the LV dielectric portion is between 40 and 150 Å thick.

6. A patterning mask for patterning a high voltage (HV) dielectric layer overlying an active area, comprising predetermined regions for a drain and a source separated by a predetermined region for a gate, isolated by an isolation structure of a semiconductor substrate, comprising:

a transparent substrate; and an opaque pattern, overlying the transparent substrate, for sheltering parts of the HV dielectric layer overlying the predetermined region for the drain and parts of the predetermined region for the gate neighboring to the predetermined region for the drain when the patterning mask is disposed over the semiconductor substrate during patterning of the HV dielectric layer, wherein the sheltered HV dielectric layer occupies a first predetermined intersection among the isolation structure and the predetermined regions for the drain and the gate, and a second predetermined intersection among the isolation structure and the predetermined regions for the source and the gate, wherein the sheltered HV dielectric layer includes a first part in physical contact with the predetermined drain region but not in contact with the predetermined source region, and a second part in physical contact with the predetermined source region but not in contact with the predetermined drain region, and wherein the first part and the second part are not in physical contact with each other.

7. The mask as claimed in claim 6, wherein the predetermined region for the gate comprises a drain side neighboring the predetermined region for the drain, and a source side neighboring the predetermined region for the source;

first part of the sheltered HV dielectric layer overlies the predetermined re ion for the drain and the drain side and occupies the first predetermined intersection, and the second part of the sheltered HV dielectric layer occupies the second predetermined intersection; and the opaque pattern comprises a first pattern for sheltering the first part, and a second pattern for sheltering the second part when the patterning mask is disposed over the semiconductor substrate during patterning of the HV dielectric layer.

* * * * *